(12) United States Patent
TenHouten et al.

(10) Patent No.: US 10,751,800 B2
(45) Date of Patent: Aug. 25, 2020

(54) METHODS AND APPARATUS FOR ADDITIVELY MANUFACTURED EXOSKELETON-BASED TRANSPORT STRUCTURES

(71) Applicant: DIVERGENT TECHNOLOGIES, INC., Los Angeles, CA (US)

(72) Inventors: Broc William TenHouten, Rancho Palos Verdes, CA (US); Kevin Robert Czinger, Santa Monica, CA (US); Stuart Paul Macey, Laguna Niguel, CA (US); David Charles O'Connell, Huntington Beach, CA (US); Jon Paul Gunner, Palos Verdes Estates, CA (US); Antonio Bernerd Martinez, El Segundo, CA (US); Narender Shankar Lakshman, Torrance, CA (US)

(73) Assignee: DIVERGENT TECHNOLOGIES, INC., Los Angeles, CA (US)

(\*) Notice: Subject to any disclaimer, the term of this patent is extended or adjusted under 35 U.S.C. 154(b) by 113 days.

(21) Appl. No.: 15/659,601

(22) Filed: Jul. 25, 2017

(65) Prior Publication Data
US 2019/0030605 A1    Jan. 31, 2019

(51) Int. Cl.
*B22F 3/15*    (2006.01)
*B22F 3/00*    (2006.01)
(Continued)

(52) U.S. Cl.
CPC .............. *B22F 3/115* (2013.01); *B22F 3/002* (2013.01); *B23K 26/0006* (2013.01);
(Continued)

(58) Field of Classification Search
CPC .......... B22F 3/115; B22F 3/002; B22F 3/008; G06F 17/5095; B29C 64/124;
(Continued)

(56) References Cited

U.S. PATENT DOCUMENTS 3,349,427 A    10/1967   Cairns et al.
3,349,430 A    10/1967   Rosenvold et al.
(Continued)

FOREIGN PATENT DOCUMENTS

CN    206458199 U    9/2017
DE    3318794 C2    11/1984
(Continued)

OTHER PUBLICATIONS

US 9,202,136 B2, 12/2015, Schmidt et al. (withdrawn)
(Continued)

*Primary Examiner* — John C Hong
(74) *Attorney, Agent, or Firm* — Arent Fox LLP

(57) ABSTRACT

Some embodiments of the present disclosure relate to additively manufactured vehicle exterior structures, designed to enclose the vehicle surface and support required operational loads. The vehicle structure includes cavities into which components that require an external interface are inserted. A plurality of components are assembled and integrated into the vehicle structure. The structure may be 3-D printed using multiple printing techniques applied in parallel or in series. In an embodiment, the components and structure are modular, use multiple materials and manufacturing techniques, and enable reparability and replacement of single parts.

54 Claims, 15 Drawing Sheets

(51) Int. Cl.

| | | |
|---|---|---|
| *B62D 27/02* | (2006.01) | |
| *B62D 31/02* | (2006.01) | |
| *B62D 65/02* | (2006.01) | |
| *G06F 17/50* | (2006.01) | |
| *B29C 64/153* | (2017.01) | |
| *B29C 64/124* | (2017.01) | |
| *B22F 3/115* | (2006.01) | |
| *B23K 26/00* | (2014.01) | |
| *B23K 26/342* | (2014.01) | |
| *B23K 26/08* | (2014.01) | |
| *B23K 26/144* | (2014.01) | |
| *B23K 26/14* | (2014.01) | |
| *G06F 30/15* | (2020.01) | |
| *B28B 1/00* | (2006.01) | |
| *B33Y 50/00* | (2015.01) | |
| *B33Y 80/00* | (2015.01) | |
| *B22F 3/105* | (2006.01) | |
| *B33Y 10/00* | (2015.01) | |
| *B33Y 30/00* | (2015.01) | |
| *B33Y 50/02* | (2015.01) | |
| *B23K 26/21* | (2014.01) | |
| *B23K 101/00* | (2006.01) | |

(52) U.S. Cl.
CPC .......... *B23K 26/0884* (2013.01); *B23K 26/14* (2013.01); *B23K 26/144* (2015.10); *B23K 26/1476* (2013.01); *B23K 26/342* (2015.10); *B28B 1/001* (2013.01); *B29C 64/124* (2017.08); *B29C 64/153* (2017.08); *B62D 27/023* (2013.01); *B62D 31/02* (2013.01); *G06F 30/15* (2020.01); *B22F 3/008* (2013.01); *B22F 3/1055* (2013.01); *B22F 2998/10* (2013.01); *B23K 26/21* (2015.10); *B23K 2101/006* (2018.08); *B33Y 10/00* (2014.12); *B33Y 30/00* (2014.12); *B33Y 50/00* (2014.12); *B33Y 50/02* (2014.12); *B33Y 80/00* (2014.12); *B62D 65/02* (2013.01)

(58) Field of Classification Search
CPC ....... B29C 64/153; B28B 1/001; B62D 65/02; B62D 31/02; B62D 27/023; B33Y 30/00; B33Y 10/00; B33Y 50/02; B33Y 50/00; B33Y 80/00; B23K 2101/006; B23K 26/21; B23K 26/144; B23K 26/342; B23K 26/1476; B23K 26/14; B23K 26/0884; B23K 26/0006
See application file for complete search history.

(56) References Cited

U.S. PATENT DOCUMENTS

| | | |
|---|---|---|
| 3,744,085 A | 7/1973 | Griego |
| 3,805,325 A | 4/1974 | Lee |
| 3,805,327 A | 4/1974 | Walker |
| 4,618,163 A | 10/1986 | Hasler et al. |
| 4,864,690 A | 9/1989 | Chen |
| 4,987,639 A | 1/1991 | Baiuley et al. |
| 5,145,076 A | 9/1992 | Murphy et al. |
| 5,203,226 A | 4/1993 | Hongou et al. |
| 5,458,393 A | 10/1995 | Benedyk |
| 5,630,519 A | 5/1997 | Burke et al. |
| 5,742,385 A | 4/1998 | Champa |
| 5,791,015 A | 8/1998 | Wandinger |
| 5,943,738 A | 8/1999 | Karfiol |
| 5,990,444 A | 11/1999 | Costin |
| 5,991,975 A | 11/1999 | Baer |
| 6,010,155 A | 1/2000 | Rinehart |
| 6,096,249 A | 8/2000 | Yamaguchi |
| 6,140,602 A | 10/2000 | Costin |
| 6,250,533 B1 | 6/2001 | Otterbein et al. |
| 6,252,196 B1 | 6/2001 | Costin et al. |
| 6,318,642 B1 | 11/2001 | Goenka et al. |
| 6,365,057 B1 | 4/2002 | Whitehurst et al. |
| 6,391,251 B1 | 5/2002 | Keicher et al. |
| 6,409,930 B1 | 6/2002 | Whitehurst et al. |
| 6,468,439 B1 | 10/2002 | Whitehurst et al. |
| 6,554,345 B2 | 4/2003 | Jonsson |
| 6,585,151 B1 | 7/2003 | Ghosh |
| 6,644,721 B1 | 11/2003 | Miskech et al. |
| 6,811,744 B2 | 11/2004 | Keicher et al. |
| 6,866,497 B2 | 3/2005 | Saiki |
| 6,919,035 B1 | 7/2005 | Clough |
| 6,926,970 B2 | 8/2005 | James et al. |
| 7,152,292 B2 | 12/2006 | Hohmann et al. |
| 7,340,800 B2 | 3/2008 | Gulley |
| 7,344,186 B1 | 3/2008 | Hausler et al. |
| 7,500,373 B2 | 3/2009 | Quell |
| 7,586,062 B2 | 9/2009 | Heberer |
| 7,637,134 B2 | 12/2009 | Burzlaff et al. |
| 7,710,347 B2 | 5/2010 | Gentilman et al. |
| 7,716,802 B2 | 5/2010 | Stern et al. |
| 7,745,293 B2 | 6/2010 | Yamazaki et al. |
| 7,766,123 B2 | 8/2010 | Sakurai et al. |
| 7,852,388 B2 | 12/2010 | Shimizu et al. |
| 7,908,922 B2 | 3/2011 | Zarabadi et al. |
| 7,951,324 B2 | 5/2011 | Naruse et al. |
| 8,094,036 B2 | 1/2012 | Heberer |
| 8,163,077 B2 | 4/2012 | Eron et al. |
| 8,286,236 B2 | 10/2012 | Jung et al. |
| 8,289,352 B2 | 10/2012 | Vartanian et al. |
| 8,297,096 B2 | 10/2012 | Mizumura et al. |
| 8,354,170 B1 | 1/2013 | Henry et al. |
| 8,383,028 B2 | 2/2013 | Lyons |
| 8,408,036 B2 | 4/2013 | Reith et al. |
| 8,429,754 B2 | 4/2013 | Jung et al. |
| 8,437,513 B1 | 5/2013 | Derakhshani et al. |
| 8,444,903 B2 | 5/2013 | Lyons et al. |
| 8,452,073 B2 | 5/2013 | Taminger et al. |
| 8,599,301 B2 | 12/2013 | Dowski, Jr. et al. |
| 8,606,540 B2 | 12/2013 | Haisty et al. |
| 8,610,761 B2 | 12/2013 | Haisty et al. |
| 8,631,996 B2 | 1/2014 | Quell et al. |
| 8,675,925 B2 | 3/2014 | Derakhshani et al. |
| 8,678,060 B2 | 3/2014 | Dietz et al. |
| 8,686,314 B2 | 4/2014 | Schneegans et al. |
| 8,686,997 B2 | 4/2014 | Radet et al. |
| 8,694,284 B2 | 4/2014 | Berard |
| 8,720,876 B2 | 5/2014 | Reith et al. |
| 8,752,166 B2 | 6/2014 | Jung et al. |
| 8,755,923 B2 | 6/2014 | Farahani et al. |
| 8,787,628 B1 | 7/2014 | Derakhshani et al. |
| 8,818,771 B2 | 8/2014 | Gielis et al. |
| 8,873,238 B2 | 10/2014 | Wilkins |
| 8,978,535 B2 | 3/2015 | Ortiz et al. |
| 9,006,605 B2 | 4/2015 | Schneegans et al. |
| 9,071,436 B2 | 6/2015 | Jung et al. |
| 9,101,979 B2 | 8/2015 | Hofmann et al. |
| 9,104,921 B2 | 8/2015 | Derakhshani et al. |
| 9,126,365 B1 | 9/2015 | Mark et al. |
| 9,128,476 B2 | 9/2015 | Jung et al. |
| 9,138,924 B2 | 9/2015 | Yen |
| 9,149,988 B2 | 10/2015 | Mark et al. |
| 9,156,205 B2 | 10/2015 | Mark et al. |
| 9,186,848 B2 | 11/2015 | Mark et al. |
| 9,244,986 B2 | 1/2016 | Karmarkar |
| 9,248,611 B2 | 2/2016 | Divine et al. |
| 9,254,535 B2 | 2/2016 | Buller et al. |
| 9,266,566 B2 | 2/2016 | Kim |
| 9,269,022 B2 | 2/2016 | Rhoads et al. |
| 9,327,452 B2 | 5/2016 | Mark et al. |
| 9,329,020 B1 | 5/2016 | Napoletano |
| 9,332,251 B2 | 5/2016 | Haisty et al. |
| 9,346,127 B2 | 5/2016 | Buller et al. |
| 9,389,315 B2 | 7/2016 | Bruder et al. |
| 9,399,256 B2 | 7/2016 | Buller et al. |
| 9,403,235 B2 | 8/2016 | Buller et al. |
| 9,418,193 B2 | 8/2016 | Dowski, Jr. et al. |
| 9,457,514 B2 | 10/2016 | Schwärzler |

(56) References Cited

U.S. PATENT DOCUMENTS

| | | |
|---|---|---|
| 9,469,057 B2 | 10/2016 | Johnson et al. |
| 9,478,063 B2 | 10/2016 | Rhoads et al. |
| 9,481,402 B1 | 11/2016 | Muto et al. |
| 9,486,878 B2 | 11/2016 | Buller et al. |
| 9,486,960 B2 | 11/2016 | Paschkewitz et al. |
| 9,502,993 B2 | 11/2016 | Deng |
| 9,525,262 B2 | 12/2016 | Stuart et al. |
| 9,533,526 B1 | 1/2017 | Nevins |
| 9,555,315 B2 | 1/2017 | Aders |
| 9,555,580 B1 | 1/2017 | Dykstra et al. |
| 9,557,856 B2 | 1/2017 | Send et al. |
| 9,566,742 B2 | 2/2017 | Keating et al. |
| 9,566,758 B2 | 2/2017 | Cheung et al. |
| 9,567,013 B2 | 2/2017 | Erlich et al. |
| 9,573,193 B2 | 2/2017 | Buller et al. |
| 9,573,225 B2 | 2/2017 | Buller et al. |
| 9,586,290 B2 | 3/2017 | Buller et al. |
| 9,595,795 B2 | 3/2017 | Lane et al. |
| 9,597,843 B2 | 3/2017 | Stauffer et al. |
| 9,600,929 B1 | 3/2017 | Young et al. |
| 9,609,755 B2 | 3/2017 | Coull et al. |
| 9,610,737 B2 | 4/2017 | Johnson et al. |
| 9,611,667 B2 | 4/2017 | GangaRao et al. |
| 9,616,623 B2 | 4/2017 | Johnson et al. |
| 9,626,487 B2 | 4/2017 | Jung et al. |
| 9,626,489 B2 | 4/2017 | Nilsson |
| 9,643,361 B2 | 5/2017 | Liu |
| 9,662,840 B1 | 5/2017 | Buller et al. |
| 9,665,182 B2 | 5/2017 | Send et al. |
| 9,672,389 B1 | 6/2017 | Mosterman et al. |
| 9,672,550 B2 | 6/2017 | Apsley et al. |
| 9,676,145 B2 | 6/2017 | Buller et al. |
| 9,684,919 B2 | 6/2017 | Apsley et al. |
| 9,688,032 B2 | 6/2017 | Kia et al. |
| 9,690,286 B2 | 6/2017 | Hovsepian et al. |
| 9,700,966 B2 | 7/2017 | Kraft et al. |
| 9,703,896 B2 | 7/2017 | Zhang et al. |
| 9,713,903 B2 | 7/2017 | Paschkewitz et al. |
| 9,718,302 B2 | 8/2017 | Young et al. |
| 9,718,434 B2 | 8/2017 | Hector, Jr. et al. |
| 9,724,877 B2 | 8/2017 | Flitsch et al. |
| 9,724,881 B2 | 8/2017 | Johnson et al. |
| 9,725,178 B2 | 8/2017 | Wang |
| 9,731,730 B2 | 8/2017 | Stiles |
| 9,731,773 B2 | 8/2017 | Gami et al. |
| 9,741,954 B2 | 8/2017 | Bruder et al. |
| 9,747,352 B2 | 8/2017 | Karmarkar |
| 9,764,415 B2 | 9/2017 | Seufzer et al. |
| 9,764,520 B2 | 9/2017 | Johnson et al. |
| 9,765,226 B2 | 9/2017 | Dain |
| 9,770,760 B2 | 9/2017 | Liu |
| 9,773,393 B2 | 9/2017 | Velez |
| 9,776,234 B2 | 10/2017 | Schaafhausen et al. |
| 9,782,936 B2 | 10/2017 | Glunz et al. |
| 9,783,324 B2 | 10/2017 | Embler et al. |
| 9,783,977 B2 | 10/2017 | Alqasimi et al. |
| 9,789,548 B2 | 10/2017 | Golshany et al. |
| 9,789,922 B2 | 10/2017 | Dosenbach et al. |
| 9,796,137 B2 | 10/2017 | Zhang et al. |
| 9,802,108 B2 | 10/2017 | Aders |
| 9,809,977 B2 | 11/2017 | Carney et al. |
| 9,817,922 B2 | 11/2017 | Glunz et al. |
| 9,818,071 B2 | 11/2017 | Jung et al. |
| 9,821,339 B2 | 11/2017 | Paschkewitz et al. |
| 9,821,411 B2 | 11/2017 | Buller et al. |
| 9,823,143 B2 | 11/2017 | Twelves, Jr. et al. |
| 9,829,564 B2 | 11/2017 | Bruder et al. |
| 9,846,933 B2 | 12/2017 | Yuksel |
| 9,854,828 B2 | 1/2018 | Langeland |
| 9,858,604 B2 | 1/2018 | Apsley et al. |
| 9,862,833 B2 | 1/2018 | Hasegawa et al. |
| 9,862,834 B2 | 1/2018 | Hasegawa et al. |
| 9,863,885 B2 | 1/2018 | Zaretski et al. |
| 9,870,629 B2 | 1/2018 | Cardno et al. |
| 9,879,981 B1 | 1/2018 | Dehghan Niri et al. |
| 9,884,663 B2 | 2/2018 | Czinger et al. |
| 9,898,776 B2 | 2/2018 | Apsley et al. |
| 9,914,150 B2 | 3/2018 | Pettersson et al. |
| 9,919,360 B2 | 3/2018 | Buller et al. |
| 9,931,697 B2 | 4/2018 | Levin et al. |
| 9,933,031 B2 | 4/2018 | Bracamonte et al. |
| 9,933,092 B2 | 4/2018 | Sindelar |
| 9,957,031 B2 | 5/2018 | Golshany et al. |
| 9,958,535 B2 | 5/2018 | Send et al. |
| 9,962,767 B2 | 5/2018 | Buller et al. |
| 9,963,978 B2 | 5/2018 | Johnson et al. |
| 9,971,920 B2 | 5/2018 | Derakhshani et al. |
| 9,976,063 B2 | 5/2018 | Childers et al. |
| 9,987,792 B2 | 6/2018 | Flitsch et al. |
| 9,988,136 B2 | 6/2018 | Tiryaki et al. |
| 9,989,623 B2 | 6/2018 | Send et al. |
| 9,990,565 B2 | 6/2018 | Rhoads et al. |
| 9,994,339 B2 | 6/2018 | Colson et al. |
| 9,996,890 B1 | 6/2018 | Cinnamon et al. |
| 9,996,945 B1 | 6/2018 | Holzer et al. |
| 10,002,215 B2 | 6/2018 | Dowski et al. |
| 10,006,156 B2 | 6/2018 | Kirkpatrick |
| 10,011,089 B2 | 7/2018 | Lyons et al. |
| 10,011,685 B2 | 7/2018 | Childers et al. |
| 10,012,532 B2 | 7/2018 | Send et al. |
| 10,013,777 B2 | 7/2018 | Mariampillai et al. |
| 10,015,908 B2 | 7/2018 | Williams et al. |
| 10,016,852 B2 | 7/2018 | Broda |
| 10,016,942 B2 | 7/2018 | Mark et al. |
| 10,017,384 B1 | 7/2018 | Greer et al. |
| 10,018,576 B2 | 7/2018 | Herbsommer et al. |
| 10,022,792 B2 | 7/2018 | Srivas et al. |
| 10,022,912 B2 | 7/2018 | Kia et al. |
| 10,027,376 B2 | 7/2018 | Sankaran et al. |
| 10,029,415 B2 | 7/2018 | Swanson et al. |
| 10,040,239 B2 | 8/2018 | Brown, Jr. |
| 10,046,412 B2 | 8/2018 | Blackmore |
| 10,048,769 B2 | 8/2018 | Selker et al. |
| 10,052,712 B2 | 8/2018 | Blackmore |
| 10,052,820 B2 | 8/2018 | Kemmer et al. |
| 10,055,536 B2 | 8/2018 | Maes et al. |
| 10,058,764 B2 | 8/2018 | Aders |
| 10,058,920 B2 | 8/2018 | Buller et al. |
| 10,061,906 B2 | 8/2018 | Nilsson |
| 10,065,270 B2 | 9/2018 | Buller et al. |
| 10,065,361 B2 | 9/2018 | Susnjara et al. |
| 10,065,367 B2 | 9/2018 | Brown, Jr. |
| 10,068,316 B1 | 9/2018 | Holzer et al. |
| 10,071,422 B2 | 9/2018 | Buller et al. |
| 10,071,525 B2 | 9/2018 | Susnjara et al. |
| 10,072,179 B2 | 9/2018 | Drijfhout |
| 10,074,128 B2 | 9/2018 | Colson et al. |
| 10,076,875 B2 | 9/2018 | Mark et al. |
| 10,076,876 B2 | 9/2018 | Mark et al. |
| 10,081,140 B2 | 9/2018 | Paesano et al. |
| 10,081,431 B2 | 9/2018 | Seack et al. |
| 10,086,568 B2 | 10/2018 | Snyder et al. |
| 10,087,320 B2 | 10/2018 | Simmons et al. |
| 10,087,556 B2 | 10/2018 | Gallucci et al. |
| 10,099,427 B2 | 10/2018 | Mark et al. |
| 10,100,542 B2 | 10/2018 | GangaRao et al. |
| 10,100,890 B2 | 10/2018 | Bracamonte et al. |
| 10,107,344 B2 | 10/2018 | Bracamonte et al. |
| 10,108,766 B2 | 10/2018 | Druckman et al. |
| 10,113,600 B2 | 10/2018 | Bracamonte et al. |
| 10,118,347 B2 | 11/2018 | Stauffer et al. |
| 10,118,579 B2 | 11/2018 | Lakic |
| 10,120,078 B2 | 11/2018 | Bruder et al. |
| 10,124,546 B2 | 11/2018 | Johnson et al. |
| 10,124,570 B2 | 11/2018 | Evans et al. |
| 10,137,500 B2 | 11/2018 | Blackmore |
| 10,138,354 B2 | 11/2018 | Groos et al. |
| 10,144,126 B2 | 12/2018 | Krohne et al. |
| 10,145,110 B2 | 12/2018 | Carney et al. |
| 10,151,363 B2 | 12/2018 | Bracamonte et al. |
| 10,152,661 B2 | 12/2018 | Kieser |
| 10,160,278 B2 | 12/2018 | Coombs et al. |
| 10,161,021 B2 | 12/2018 | Lin et al. |
| 10,166,752 B2 | 1/2019 | Evans et al. |

(56) References Cited

U.S. PATENT DOCUMENTS

| | | |
|---|---|---|
| 10,166,753 B2 | 1/2019 | Evans et al. |
| 10,171,578 B1 | 1/2019 | Cook et al. |
| 10,173,255 B2 | 1/2019 | TenHouten et al. |
| 10,173,327 B2 | 1/2019 | Kraft et al. |
| 10,178,800 B2 | 1/2019 | Mahalingam et al. |
| 10,179,640 B2 | 1/2019 | Wilkerson |
| 10,183,330 B2 | 1/2019 | Buller et al. |
| 10,183,478 B2 | 1/2019 | Evans et al. |
| 10,189,187 B2 | 1/2019 | Keating et al. |
| 10,189,240 B2 | 1/2019 | Evans et al. |
| 10,189,241 B2 | 1/2019 | Evans et al. |
| 10,189,242 B2 | 1/2019 | Evans et al. |
| 10,190,424 B2 | 1/2019 | Johnson et al. |
| 10,195,693 B2 | 2/2019 | Buller et al. |
| 10,196,539 B2 | 2/2019 | Boonen et al. |
| 10,197,338 B2 | 2/2019 | Melsheimer |
| 10,200,677 B2 | 2/2019 | Trevor et al. |
| 10,201,932 B2 | 2/2019 | Flitsch et al. |
| 10,201,941 B2 | 2/2019 | Evans et al. |
| 10,202,673 B2 | 2/2019 | Lin et al. |
| 10,204,216 B2 | 2/2019 | Nejati et al. |
| 10,207,454 B2 | 2/2019 | Buller et al. |
| 10,209,065 B2 | 2/2019 | Estevo, Jr. et al. |
| 10,210,662 B2 | 2/2019 | Holzer et al. |
| 10,213,837 B2 | 2/2019 | Kondoh |
| 10,214,248 B2 | 2/2019 | Hall et al. |
| 10,214,252 B2 | 2/2019 | Schellekens et al. |
| 10,214,275 B2 | 2/2019 | Goehlich |
| 10,220,575 B2 | 3/2019 | Reznar |
| 10,220,881 B2 | 3/2019 | Tyan et al. |
| 10,221,530 B2 | 3/2019 | Driskell et al. |
| 10,226,900 B1 | 3/2019 | Nevins |
| 10,232,550 B2 | 3/2019 | Evans et al. |
| 10,234,342 B2 | 3/2019 | Moorlag et al. |
| 10,237,477 B2 | 3/2019 | Trevor et al. |
| 10,252,335 B2 | 4/2019 | Buller et al. |
| 10,252,336 B2 | 4/2019 | Buller et al. |
| 10,254,499 B1 | 4/2019 | Cohen et al. |
| 10,257,499 B2 | 4/2019 | Hintz et al. |
| 10,259,044 B2 | 4/2019 | Buller et al. |
| 10,268,181 B1 | 4/2019 | Nevins |
| 10,269,225 B2 | 4/2019 | Velez |
| 10,272,860 B2 | 4/2019 | Mohapatra et al. |
| 10,272,862 B2 | 4/2019 | Whitehead |
| 10,275,564 B2 | 4/2019 | Ridgeway et al. |
| 10,279,580 B2 | 5/2019 | Evans et al. |
| 10,285,219 B2 | 5/2019 | Fetfatsidis et al. |
| 10,286,452 B2 | 5/2019 | Buller et al. |
| 10,286,603 B2 | 5/2019 | Buller et al. |
| 10,286,961 B2 | 5/2019 | Hillebrecht et al. |
| 10,289,263 B2 | 5/2019 | Troy et al. |
| 10,289,875 B2 | 5/2019 | Singh et al. |
| 10,291,193 B2 | 5/2019 | Dandu et al. |
| 10,294,552 B2 | 5/2019 | Liu et al. |
| 10,294,982 B2 | 5/2019 | Gabrys et al. |
| 10,295,989 B1 | 5/2019 | Nevins |
| 10,303,159 B2 | 5/2019 | Czinger et al. |
| 10,307,824 B2 | 6/2019 | Kondoh |
| 10,310,197 B1 | 6/2019 | Droz et al. |
| 10,313,651 B2 | 6/2019 | Trevor et al. |
| 10,315,252 B2 | 6/2019 | Mendelsberg et al. |
| 10,336,050 B2 | 7/2019 | Susnjara |
| 10,337,542 B2 | 7/2019 | Hesslewood et al. |
| 10,337,952 B2 | 7/2019 | Bosetti et al. |
| 10,339,266 B2 | 7/2019 | Urick et al. |
| 10,343,330 B2 | 7/2019 | Evans et al. |
| 10,343,331 B2 | 7/2019 | McCall et al. |
| 10,343,355 B2 | 7/2019 | Evans et al. |
| 10,343,724 B2 | 7/2019 | Polewarczyk et al. |
| 10,343,725 B2 | 7/2019 | Martin et al. |
| 10,350,823 B2 | 7/2019 | Rolland et al. |
| 10,356,341 B2 | 7/2019 | Holzer et al. |
| 10,356,395 B2 | 7/2019 | Holzer et al. |
| 10,357,829 B2 | 7/2019 | Spink et al. |
| 10,357,957 B2 | 7/2019 | Buller et al. |
| 10,359,756 B2 | 7/2019 | Newell et al. |
| 10,369,629 B2 | 8/2019 | Mendelsberg et al. |
| 10,382,739 B1 | 8/2019 | Rusu et al. |
| 10,384,393 B2 | 8/2019 | Xu et al. |
| 10,384,416 B2 | 8/2019 | Cheung et al. |
| 10,389,410 B2 | 8/2019 | Brooks et al. |
| 10,391,710 B2 | 8/2019 | Mondesir |
| 10,392,097 B2 | 8/2019 | Pham et al. |
| 10,392,131 B2 | 8/2019 | Deck et al. |
| 10,393,315 B2 | 8/2019 | Tyan |
| 10,400,080 B2 | 9/2019 | Ramakrishnan et al. |
| 10,401,832 B2 | 9/2019 | Snyder et al. |
| 10,403,009 B2 | 9/2019 | Mariampillai et al. |
| 10,406,750 B2 | 9/2019 | Barton et al. |
| 10,412,283 B2 | 9/2019 | Send et al. |
| 10,416,095 B2 | 9/2019 | Herbsommer et al. |
| 10,421,496 B2 | 9/2019 | Swayne et al. |
| 10,421,863 B2 | 9/2019 | Hasegawa et al. |
| 10,422,478 B2 | 9/2019 | Leachman et al. |
| 10,425,793 B2 | 9/2019 | Sankaran et al. |
| 10,427,364 B2 | 10/2019 | Alves |
| 10,429,006 B2 | 10/2019 | Tyan et al. |
| 10,434,573 B2 | 10/2019 | Buller et al. |
| 10,435,185 B2 | 10/2019 | Divine et al. |
| 10,435,773 B2 | 10/2019 | Liu et al. |
| 10,436,038 B2 | 10/2019 | Buhler et al. |
| 10,438,407 B2 | 10/2019 | Pavanaskar et al. |
| 10,440,351 B2 | 10/2019 | Holzer et al. |
| 10,442,002 B2 | 10/2019 | Benthien et al. |
| 10,442,003 B2 | 10/2019 | Symeonidis et al. |
| 10,449,696 B2 | 10/2019 | Elgar et al. |
| 10,449,737 B2 | 10/2019 | Johnson et al. |
| 10,461,810 B2 | 10/2019 | Cook et al. |
| 2002/0043814 A1 | 4/2002 | Weiman |
| 2002/0050064 A1 | 5/2002 | Furuse et al. |
| 2002/0112319 A1 | 8/2002 | Kida |
| 2006/0108783 A1 | 5/2006 | Ni et al. |
| 2007/0246972 A1 | 10/2007 | Favaretto |
| 2008/0134466 A1 | 6/2008 | Massengill |
| 2010/0101054 A1 | 4/2010 | Cook |
| 2011/0158741 A1 | 6/2011 | Knaebel |
| 2014/0086704 A1 | 3/2014 | Hemingway et al. |
| 2014/0277669 A1 | 9/2014 | Nardi et al. |
| 2016/0237828 A1* | 8/2016 | Burd ................ B22F 5/04 |
| 2016/0238324 A1* | 8/2016 | Butcher ............ B29C 64/10 |
| 2016/0297479 A1 | 10/2016 | Ritschel et al. |
| 2017/0096847 A1 | 4/2017 | Liu et al. |
| 2017/0113344 A1 | 4/2017 | Schönberg |
| 2017/0136697 A1* | 5/2017 | Kia ................ B29C 64/165 |
| 2017/0259502 A1* | 9/2017 | Chapiro ............ B33Y 10/00 |
| 2017/0304946 A1* | 10/2017 | Shibazaki ......... B33Y 10/00 |
| 2017/0341309 A1 | 11/2017 | Piepenbrock et al. |
| 2018/0318929 A1* | 11/2018 | Matthews .......... B22F 3/115 |
| 2019/0308739 A1 | 10/2019 | Messina |

FOREIGN PATENT DOCUMENTS

| | | |
|---|---|---|
| DE | 201620105052 U1 | 4/2017 |
| DE | 102015215695 B4 | 8/2017 |
| WO | 1996036455 A1 | 11/1996 |
| WO | 1996036525 A1 | 11/1996 |
| WO | 1996038260 A1 | 12/1996 |
| WO | 2003024641 A1 | 3/2003 |
| WO | 2004108343 A1 | 12/2004 |
| WO | 2005093773 A1 | 10/2005 |
| WO | 2007003375 A1 | 1/2007 |
| WO | 2007110235 A1 | 10/2007 |
| WO | 2007110236 A1 | 10/2007 |
| WO | 2008019847 A1 | 2/2008 |
| WO | 2007128586 A3 | 6/2008 |
| WO | 2008068314 A2 | 6/2008 |
| WO | 2008086994 A1 | 7/2008 |
| WO | 2008087024 A1 | 7/2008 |
| WO | 2008107130 A1 | 9/2008 |
| WO | 2008138503 A1 | 11/2008 |
| WO | 2008145396 A1 | 12/2008 |
| WO | 2009083609 A2 | 7/2009 |
| WO | 2009098285 A1 | 8/2009 |
| WO | 2009112520 A1 | 9/2009 |

(56) References Cited

FOREIGN PATENT DOCUMENTS

| WO | 2009135938 A1 | 11/2009 |
|---|---|---|
| WO | 2009140977 A1 | 11/2009 |
| WO | 2010125057 A2 | 11/2010 |
| WO | 2010125058 A1 | 11/2010 |
| WO | 2010142703 A2 | 12/2010 |
| WO | 2011032533 A1 | 3/2011 |
| WO | 2014016437 A1 | 1/2014 |
| WO | 2014187720 A1 | 11/2014 |
| WO | 2014195340 A1 | 12/2014 |
| WO | 2015193331 A1 | 12/2015 |
| WO | 2016116414 A1 | 7/2016 |
| WO | 2017036461 A1 | 3/2017 |
| WO | 2019030248 A1 | 2/2019 |
| WO | 2019042504 A1 | 3/2019 |
| WO | 2019048010 A1 | 3/2019 |
| WO | 2019048498 A1 | 3/2019 |
| WO | 2019048680 A1 | 3/2019 |
| WO | 2019048682 A1 | 3/2019 |

OTHER PUBLICATIONS

US 9,809,265 B2, 11/2017, Kinjo (withdrawn)
US 10,449,880 B2, 10/2019, Mizobata et al. (withdrawn)
First Notification to Make Rectifications dated Feb. 11, 2019, regarding China Application No. 201821185096.3.
Notification of First Office Action dated May 20, 2019 regarding China Application No. 201821185096.3.
Notification of the Second Office Action received in Chinese Patent Application No. 201821185096.3 dated Aug. 26, 2019, with English Translation.
International Search Report and Written Opinion dated Jun. 7, 2019, regarding PCT/US2019/022937.

* cited by examiner

METHODS AND APPARATUS FOR ADDITIVELY MANUFACTURED EXOSKELETON-BASED TRANSPORT STRUCTURES

BACKGROUND

Field

The present disclosure relates generally to techniques for additive manufacturing (AM), and more specifically to techniques for 3-D printing transport structures and substructures used as modular components in such transport structures.

Background

Additive Manufacturing (AM) processes involve the use of a stored geometrical model for accumulating layered materials on a 'build plate' to produce three-dimensional (3-D) objects having features defined by the model. AM techniques are capable of printing complex components using a wide variety of materials. A 3-D object is fabricated based on a computer aided design (CAD) model. The AM process can create a solid three-dimensional object using the CAD model.

One such method is called Direct Metal Deposition (DMD). DMD is an AM technology that uses a laser to melt metallic powder and thereby transform it into a solid metal object. Unlike many of the other AM technologies, DMD is not based on a powder bed. Instead, DMD uses a feed nozzle to propel the powder into the laser beam. The powdered metal is then fused by the laser. While supports or a freeform substrate may in some cases be used to maintain the structure being built, almost all the powder in DMD is transformed into solid metal and consequently little waste powder is left to recycle. Using a layer by layer strategy, the print head, composed of the laser beam and the feed nozzle, can scan the substrate to deposit successive layers. All kinds of metallic materials can be processed using this technology including, for example, steel, aluminum, nickel alloys, titanium, cobalt, copper, and the like.

Other AM processes such as powder bed fusion (PBF) use a laser to sinter or melt metallic powder deposited in a powder bed, which then bonds the powder particles together in targeted areas to produce a 3-D structure having the desired geometry. Different materials or combinations of material, such as metals, engineering plastics, thermoplastic elastomers, metals, and ceramics may be used in PBF to create the 3-D object. Other more advanced AM techniques, including those discussed further below, are also available or under current development, and each may be applicable to the teachings herein.

As AM processes continue to improve, manufacturers are increasingly investigating the benefits of using AM components in their designs. Despite recent advances in AM characteristics like build plate size, print speed and precision, and other progressively more sophisticated features of AM-based technology, the use of AM in the various transport structure industries has, for the most part, remained limited to producing relatively small-scale components when compared to the size of the transport structure overall. Thus the potential for using AM to develop larger and increasingly sophisticated substructures of such mechanisms remains largely untapped.

SUMMARY

Several aspects of techniques for additively manufacturing (AM) transport structures including, in one illustrative aspect, vehicle AM structures designed to enclose the vehicle exterior surface and support required operational loads, will be described more fully hereinafter with reference to three-dimensional printing techniques.

An aspect of an apparatus for assembly into a transport structure includes an additively-manufactured (AM) structure comprising an exterior surface, the AM structure configured to accept operational loads and to protect an occupant in an event of impact, wherein the exterior surface comprises a plurality of cavities for housing components that use an external interface.

An aspect of a transport structure includes an additively manufactured contoured sandwich panel, and a plurality of components assembled into the sandwich panel, wherein the sandwich panel is configured to support principal structural loads of the transport structure.

An aspect of a method of producing a transport structure includes additively manufacturing (AM) a frame, the AM frame including a structure configured to accept operational loads and to protect an occupant in an event of an impact, and assembling a plurality of components into the AM frame, wherein the AM frame comprises a plurality of cavities for housing components of the plurality of components that require an external interface.

An aspect of a multi-aspect printer includes a substrate defining a build region, an applicator configured to provide material for building a structure in the build region, and first and second processor-controlled arm assemblies configured to extend over the build region, wherein the first and second arm assemblies are each configured to perform a function corresponding to a distinct additive manufacturing (AM) technology.

An aspect of a method for producing a component using a multi-aspect printer (MAP) includes additively manufacturing a first portion of the component on a substrate using a first AM technology provided by the MAP, and additively manufacturing a second portion of the component on the substrate using a second AM technology provided by the MAP.

It will be understood that other aspects of additively manufacturing transport structures will become readily apparent to those skilled in the art from the following detailed description, wherein it is shown and described only several embodiments by way of illustration. As will be realized by those skilled in the art, the additively manufacturing transport structures are capable of other and different embodiments and its several details are capable of modification in various other respects, all without departing from the invention. Accordingly, the drawings and detailed description are to be regarded as illustrative in nature and not as restrictive.

BRIEF DESCRIPTION OF THE DRAWINGS

Various aspects of the methods and apparatuses for additively manufacturing transport structures will now be presented in the detailed description by way of example, and not by way of limitation, in the accompanying drawings, wherein.

DETAILED DESCRIPTION

Figure 1:
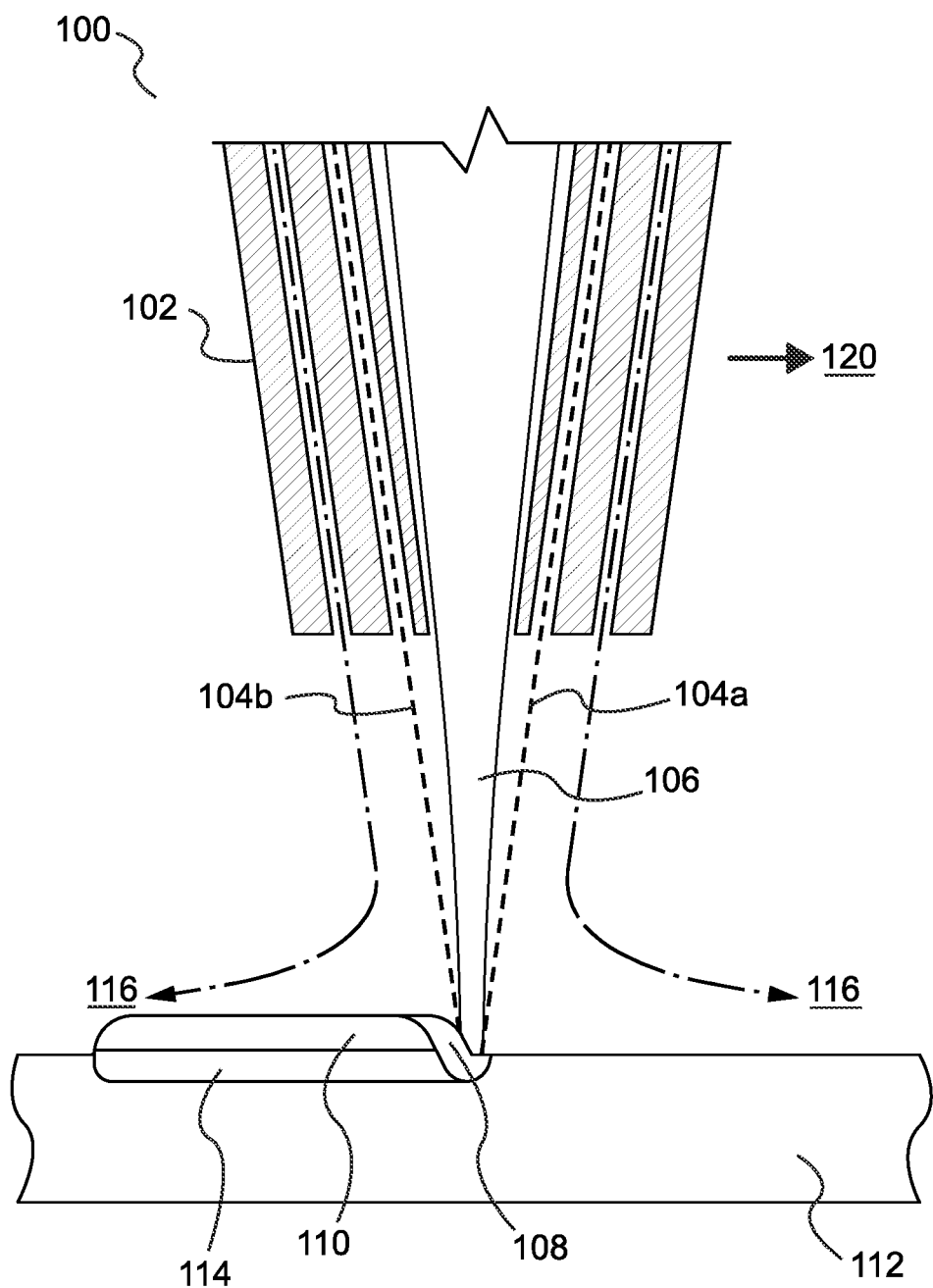
FIG. 1 illustrates an exemplary embodiment of certain aspects of a Direct Metal Deposition (DMD) 3-D printer.

The detailed description set forth below in connection with the appended drawings is intended to provide a description of various exemplary embodiments of additively manufacturing transport structures and is not intended to represent the only embodiments in which the invention may be practiced. The term "exemplary" used throughout this disclosure means "serving as an example, instance, or illustration," and should not necessarily be construed as preferred or advantageous over other embodiments presented in this disclosure. The detailed description includes specific details for the purpose of providing a thorough and complete disclosure that fully conveys the scope of the invention to those skilled in the art. However, the invention may be practiced without these specific details. In some instances, well-known structures and components may be shown in block diagram form, or omitted entirely, in order to avoid obscuring the various concepts presented throughout this disclosure.

This disclosure is generally directed to the modular assembly of vehicles and other transport structures using specific additive manufacturing techniques. In an exemplary aspect of the disclosure, certain components of such transport structures can represent modular components. As shown below, the combination of the additive manufacturing techniques with the modular properties of the transport may be used to add value and efficiency to the transport structures. In addition, such techniques can provide distinct advantages to a user. These points are addressed in greater detail below.

Manufacturers that stand to benefit from this proposed combination of features include those that manufacture virtually any mechanized form of transport, which often rely heavily on complex and labor intensive machine tools and molding techniques, and whose products often require the development of complex panels, nodes, and interconnects to be integrated with intricate machinery such as combustion engines, transmissions and increasingly sophisticated electronic techniques. Examples of such transport structures include, among others, trucks, trains, boats, aircraft, tractors, motorcycles, busses, trains, and the like.

Additive Manufacturing (3-D Printing).

A variety of different AM techniques have been used to 3-D print components composed of various types of materials. Numerous available techniques exist, and more are being developed. For example, Directed Energy Deposition (DED) AM systems use directed energy sourced from laser or electron beams to melt metal. These systems utilize both powder and wire feeds. The wire feed systems advantageously have higher deposition rates than other prominent AM techniques. Single Pass Jetting (SPJ) combines two powder spreaders and a single print unit to spread metal powder and to print a structure in a single pass with apparently no wasted motion. As another illustration, electron beam additive manufacturing processes use an electron beam to deposit metal via wire feedstock or sintering on a powder bed in a vacuum chamber. Single Pass Jetting is another exemplary technology claimed by its developers to be much quicker than conventional laser-based systems. Atomic Diffusion Additive Manufacturing (ADAM) is still another recently developed technology in which components are printed, layer-by-layer, using a metal powder in a plastic binder. After printing, plastic binders are removed and the entire part is sintered at once into a desired metal.

One of several such AM techniques, as noted, is DMD. FIG. 1 illustrates an exemplary embodiment of certain aspects of a DMD 3-D printer 100. DMD printer 100 uses feed nozzle 102 moving in a predefined direction 120 to propel powder streams 104a and 104b into a laser beam 106, which is directed toward a workpiece 112 that may be supported by a substrate. Feed nozzle may also include mechanisms for streaming a shield gas 116 to protect the welded area from oxygen, water vapor, or other components.

The powdered metal is then fused by the laser 106 in a melt pool region 108, which may then bond to the workpiece 112 as a region of deposited material 110. The dilution area 114 may include a region of the workpiece where the deposited powder is integrated with the local material of the workpiece. The feed nozzle 102 may be supported by a computer numerical controlled (CNC) robot or a gantry, or other computer-controlled mechanism. The feed nozzle 102 may be moved under computer control multiple times along a predetermined direction of the substrate until an initial layer of the deposited material 110 is formed over a desired area of the workpiece 112. The feed nozzle 102 can then scan the region immediately above the prior layer to deposit successive layers until the desired structure is formed. In general, the feed nozzle 102 may be configured to move with respect to all three axes, and in some instances to rotate on its own axis by a predetermined amount.

Figure 2:
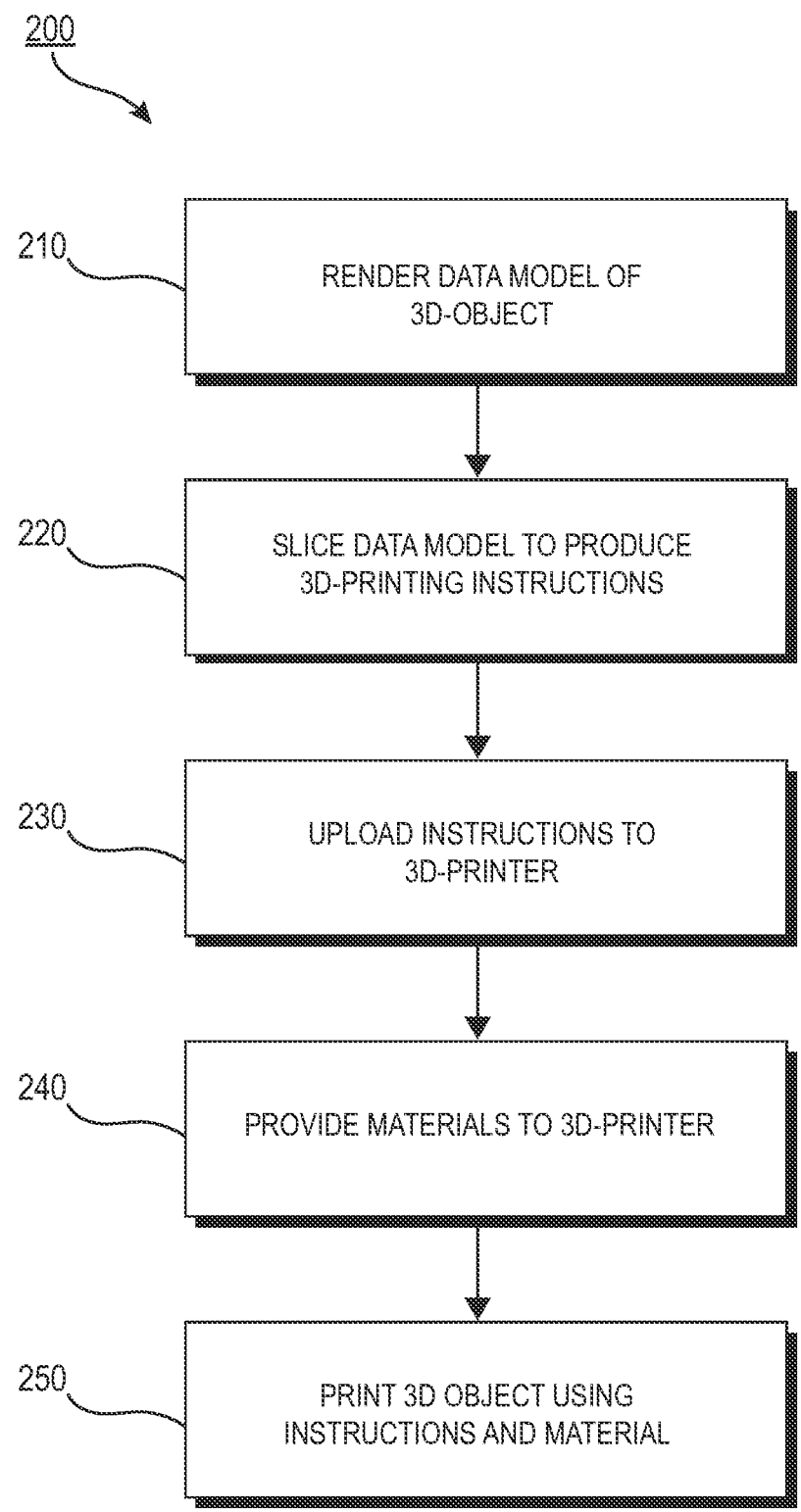
FIG. 2 illustrates a conceptual flow diagram of a 3-D printing process using a 3-D printer.

FIG. 2 is a flow diagram 200 illustrating an exemplary process of 3-D printing. A data model of the desired 3-D object to be printed is rendered (step 210). A data model is a virtual design of the 3-D object. Thus, the data model may reflect the geometrical and structural features of the 3-D object, as well as its material composition. The data model may be created using a variety of methods, including CAE-based optimization, 3D modeling, photogrammetry software, and camera imaging. CAE-based optimization may include, for example, cloud-based optimization, fatigue analysis, linear or non-linear finite element analysis (FEA), and durability analysis.

3-D modeling software, in turn, may include one of numerous commercially available 3-D modeling software applications. Data models may be rendered using a suitable computer-aided design (CAD) package, for example in an STL format. STL (stereolithography) is one example of a file format associated with commercially available stereolithography-based CAD software. A CAD program may be used to create the data model of the 3-D object as an STL file. Thereupon, the STL file may undergo a process whereby errors in the file are identified and resolved.

Following error resolution, the data model can be "sliced" by a software application known as a slicer to thereby produce a set of instructions for 3-D printing the object, with the instructions being compatible and associated with the particular 3-D printing technology to be utilized (step 220). Numerous slicer programs are commercially available. Generally, the slicer program converts the data model into a series of individual layers representing thin slices (e.g., 100 microns thick) of the object be printed, along with a file containing the printer-specific instructions for 3-D printing these successive individual layers to produce an actual 3-D printed representation of the data model.

The layers associated with 3-D printers and related print instructions need not be planar or identical in thickness. For example, in some embodiments depending on factors like the technical sophistication of the 3-D printing equipment and the specific manufacturing objectives, etc., the layers in a 3-D printed structure may be non-planar and/or may vary in one or more instances with respect to their individual thicknesses. For example, in some exemplary embodiments, a build piece may be additively manufactured using PBF, after which DMD may be applied to change a region of the build piece using a non-flat layer structure and/or layers having different thicknesses.

A common type of file used for slicing data models into layers is a G-code file, which is a numerical control programming language that includes instructions for 3-D printing the object. The G-code file, or other file constituting the instructions, is uploaded to the 3-D printer (step 230). Because the file containing these instructions is typically configured to be operable with a specific 3-D printing process, it will be appreciated that many formats of the instruction file are possible depending on the 3-D printing technology used.

In addition to the printing instructions that dictate what and how an object is to be rendered, the appropriate physical materials necessary for use by the 3-D printer in rendering the object are loaded into the 3-D printer using any of several conventional and often printer-specific methods (step 240). In DMD techniques, for example, one or more metal powders may be selected for layering structures with such metals or metal alloys. In selective laser melting (SLM), selective laser sintering (SLS), and other PBF-based AM methods (see below), the materials may be loaded as powders into chambers that feed the powders to a build platform. Depending on the 3-D printer, other techniques for loading printing materials may be used.

The respective data slices of the 3-D object are then printed based on the provided instructions using the material(s) (step 250). In 3-D printers that use laser sintering, a laser scans a powder bed and melts the powder together where structure is desired, and avoids scanning areas where the sliced data indicates that nothing is to be printed. This process may be repeated thousands of times until the desired structure is formed, after which the printed part is removed from a fabricator. In fused deposition modelling, as described above, parts are printed by applying successive layers of model and support materials to a substrate. In general, any suitable 3-D printing technology may be employed for purposes of this disclosure.

Another AM technique includes powder-bed fusion ("PBF"). Like DMD, PBF creates 'build pieces' layer-by-layer. Each layer or 'slice' is formed by depositing a layer of powder and exposing portions of the powder to an energy beam. The energy beam is applied to melt areas of the powder layer that coincide with the cross-section of the build piece in the layer. The melted powder cools and fuses to form a slice of the build piece. The process can be repeated to form the next slice of the build piece, and so on. Each layer is deposited on top of the previous layer. The resulting structure is a build piece assembled slice-by-slice from the ground up.

FIGS. 3A-D illustrate respective side views of an exemplary PBF system 300 during different stages of operation. As noted above, the particular embodiment illustrated in FIGS. 3A-D is one of many suitable examples of a PBF system employing principles of this disclosure. It should also be noted that elements of FIGS. 3A-D and the other figures in this disclosure are not necessarily drawn to scale, but may be drawn larger or smaller for the purpose of better illustration of concepts described herein. PBF system 300 can include a depositor 301 that can deposit each layer of metal powder, an energy beam source 303 that can generate an energy beam, a deflector 305 that can apply the energy beam to fuse the powder, and a build plate 307 that can support one or more build pieces, such as a build piece 309. PBF system 300 can also include a build floor 311 positioned within a powder bed receptacle. The walls of the powder bed receptacle 312 generally define the boundaries of the powder bed receptacle, which is sandwiched between the walls 312 from the side and abuts a portion of the build floor 311 below. Build floor 311 can progressively lower build plate 307 so that depositor 301 can deposit a next layer. The entire mechanism may reside in a chamber 313 that can enclose the other components, thereby protecting the equipment, enabling atmospheric and temperature regulation and mitigating contamination risks. Depositor 301 can include a hopper 315 that contains a powder 317, such as a metal powder, and a leveler 319 that can level the top of each layer of deposited powder.

Figure 3A:
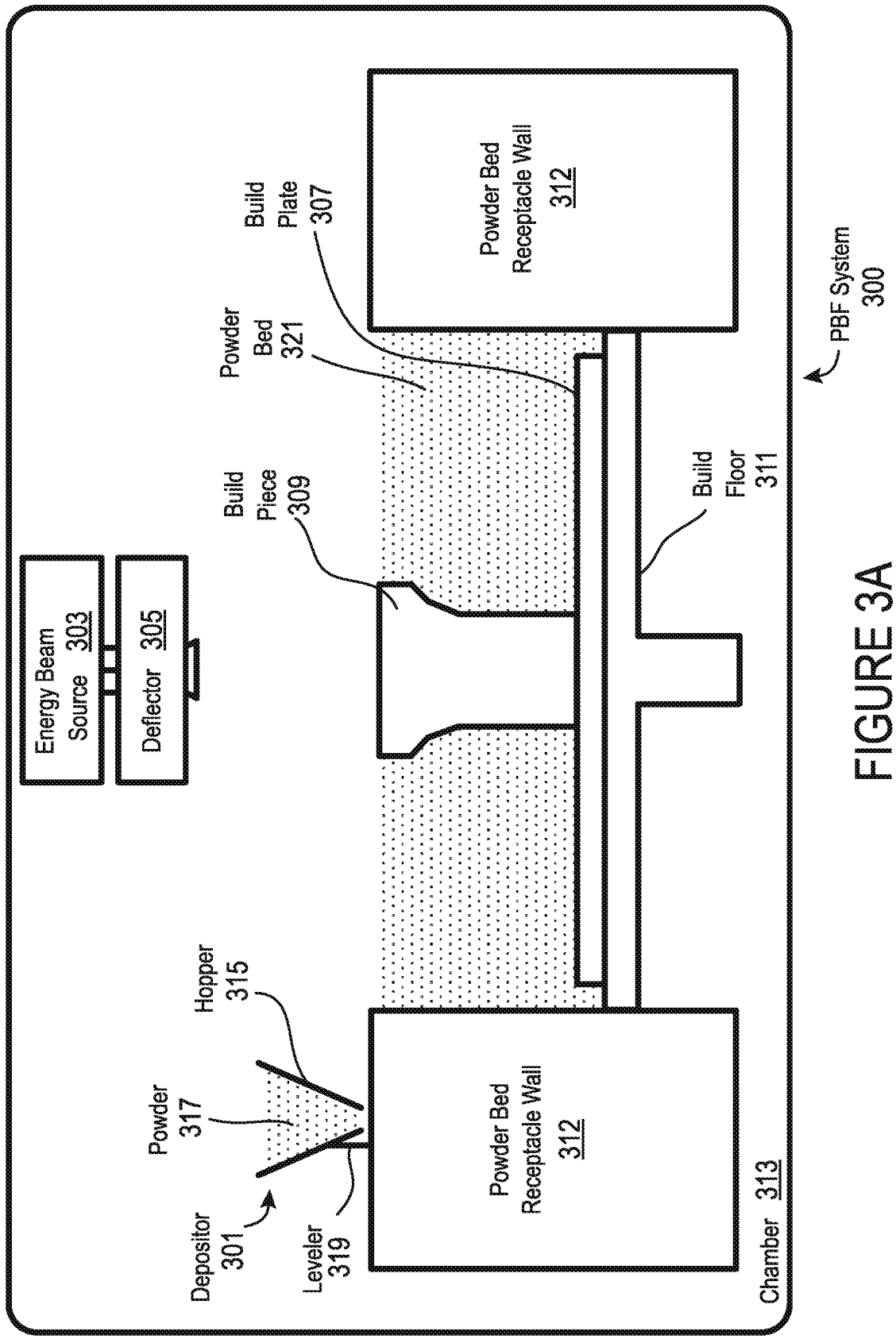
FIGS. 3A-D illustrate an exemplary powder bed fusion (PBF) system during different stages of operation.

Referring specifically to FIG. 3A, this figure shows PBF system 300 after a slice of build piece 309 has been fused, but before the next layer of powder has been deposited. In fact, FIG. 3A illustrates a time at which PBF system 300 has already deposited and fused slices in multiple layers, e.g., 150 layers, to form the current state of build piece 309, e.g., formed of 150 slices. The multiple layers already deposited have created a powder bed 321, which includes powder that was deposited but not fused.

Figure 3B:
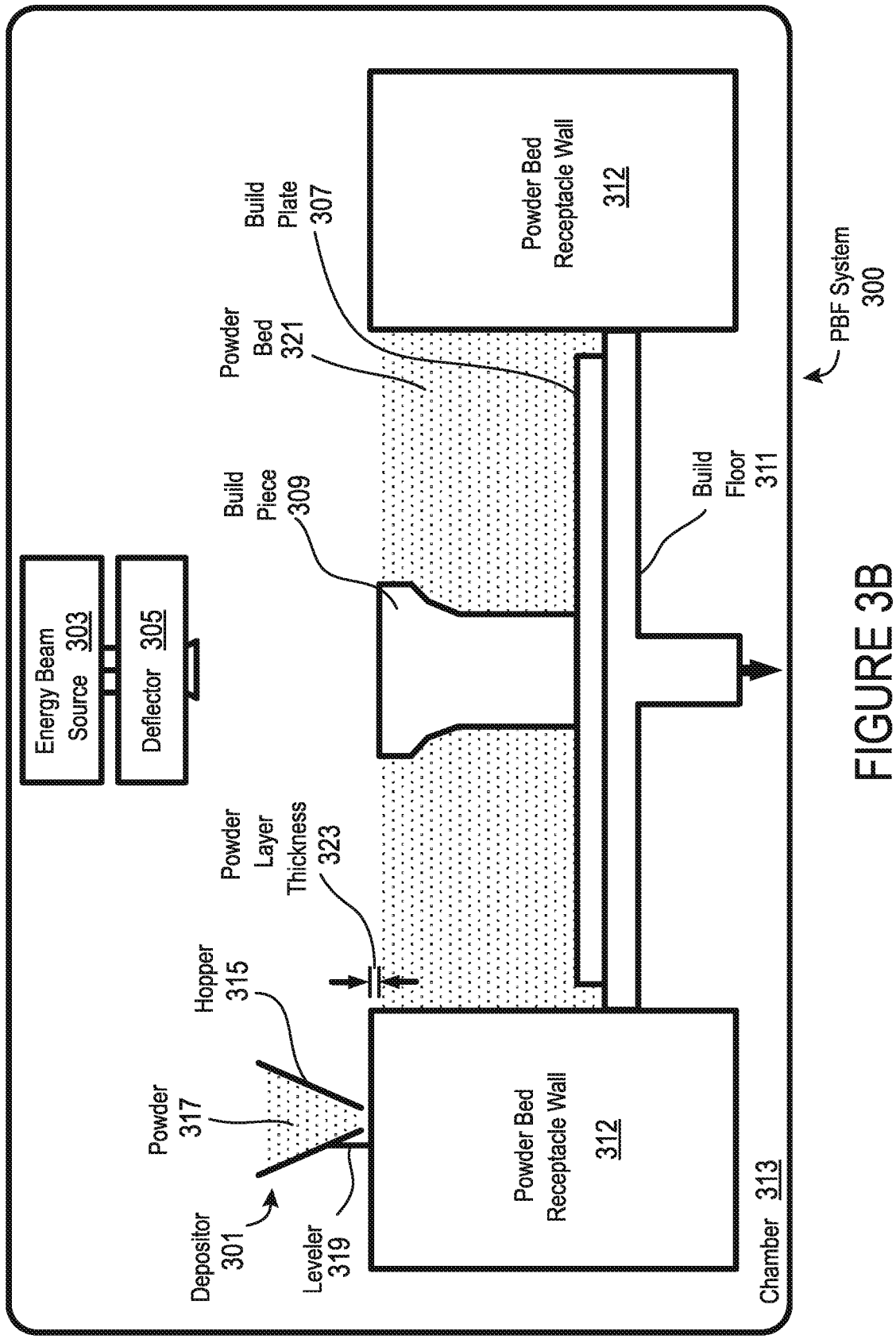

FIG. 3B shows PBF system 300 at a stage in which build floor 311 can lower by a powder layer thickness 323. The lowering of build floor 311 causes build piece 309 and powder bed 321 to drop by powder layer thickness 323, so that the top of the build piece and powder bed are lower than the top of powder bed receptacle wall 312 by an amount equal to the powder layer thickness. In this way, for example, a space with a consistent thickness equal to powder layer thickness 323 can be created over the tops of build piece 309 and powder bed 321.

Figure 3C:
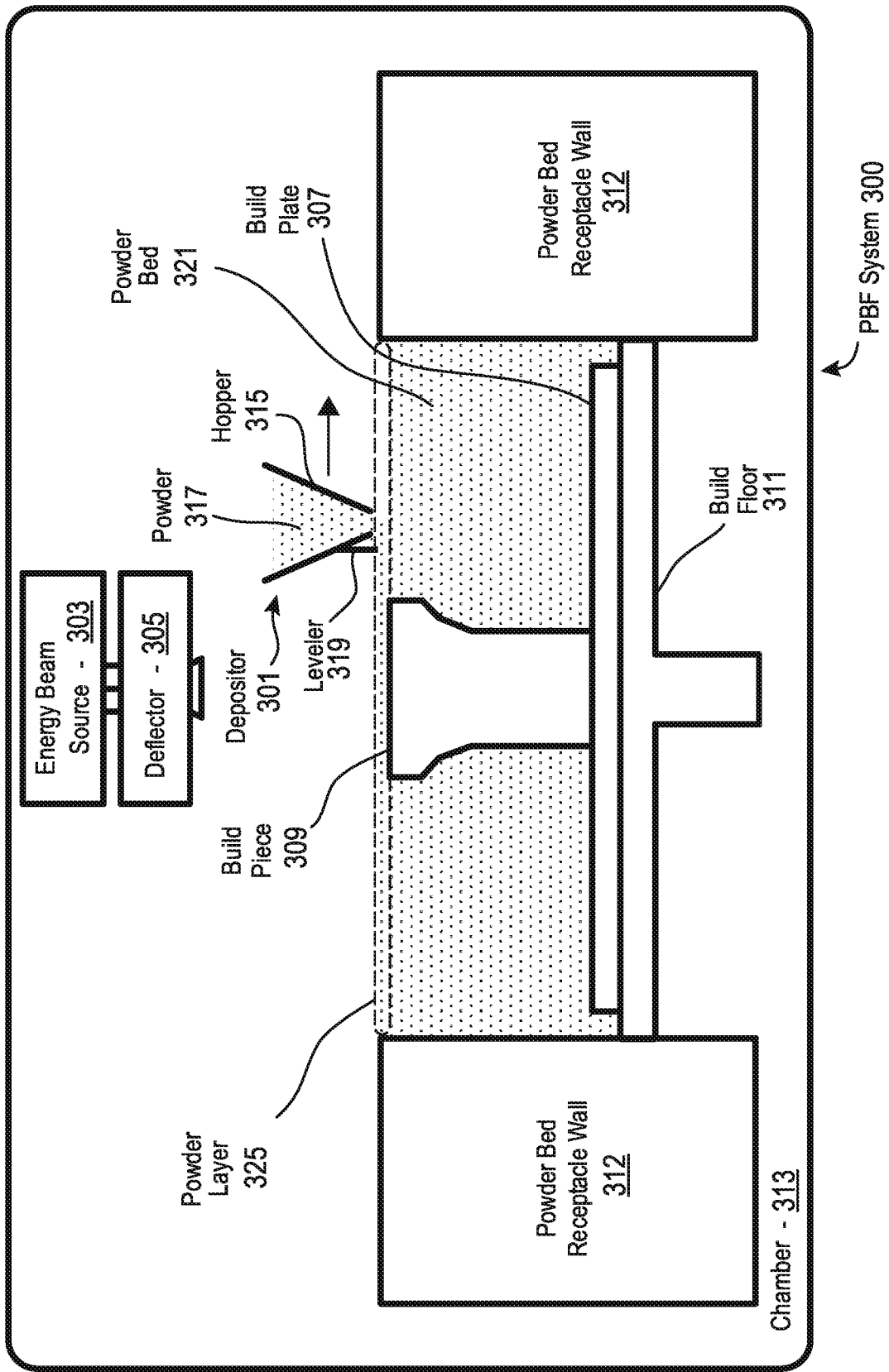

FIG. 3C shows PBF system 300 at a stage in which depositor 301 is positioned to deposit powder 317 in a space created over the top surfaces of build piece 309 and powder bed 321 and bounded by powder bed receptacle walls 312. In this example, depositor 301 progressively moves over the defined space while releasing powder 317 from hopper 315. Leveler 319 can level the released powder to form a powder layer 325 that has a thickness substantially equal to the powder layer thickness 323 (see FIG. 3B). Thus, the powder in a PBF system can be supported by a powder support structure, which can include, for example, a build plate 307, a build floor 311, a build piece 309, walls 312, and the like. It should be noted that the illustrated thickness of powder layer 325 (i.e., powder layer thickness 323 (FIG. 3B)) is greater than an actual thickness used for the example involving 350 previously-deposited layers discussed above with reference to FIG. 3A.

Figure 3D:
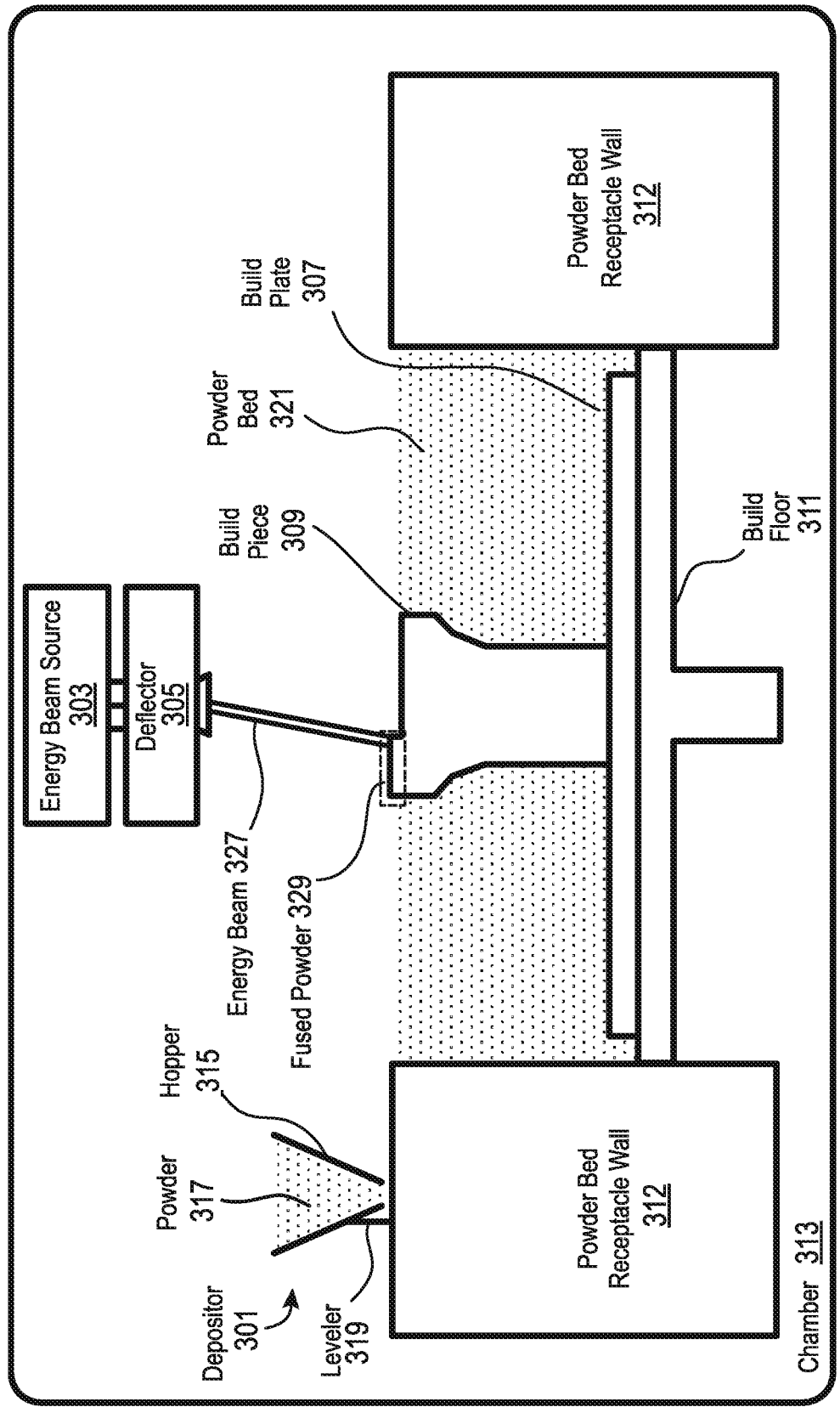

FIG. 3D shows PBF system 300 at a stage in which, following the deposition of powder layer 325 (FIG. 3C), energy beam source 303 generates an energy beam 327 and deflector 305 applies the energy beam to fuse the next slice in build piece 309. In various exemplary embodiments, energy beam source 303 can be an electron beam source, in which case energy beam 327 constitutes an electron beam. Deflector 305 can include deflection plates that can generate an electric field or a magnetic field that selectively deflects the electron beam to cause the electron beam to scan across areas designated to be fused. In various embodiments, energy beam source 303 can be a laser, in which case energy beam 327 is a laser beam. Deflector 305 can include an optical system that uses reflection and/or refraction to manipulate the laser beam to scan selected areas to be fused.

In various embodiments, the deflector 305 can include one or more gimbals and actuators that can rotate and/or translate the energy beam source to position the energy beam. In various embodiments, energy beam source 303 and/or deflector 305 can modulate the energy beam, e.g., turn the energy beam on and off as the deflector scans so that the energy beam is applied only in the appropriate areas of the powder layer. For example, in various embodiments, the energy beam can be modulated by a digital signal processor (DSP).

Multi-Aspect Printing.

To streamline the manufacturing process and maximize efficiency in accordance with an aspect of the disclosure, multi-aspect printing is used. It may be desirable or necessary in many cases to produce components using a plurality of manufacturing processes. Conventionally, to accomplish this result, different dedicated machines are used. Thus, for example, a panel may be produced in part using DMD or PBF-based AM techniques, and then portions of the panel may undergo a finishing technique using FDM or spray forming processes. Additionally, subtractive manufacturing processes may also be necessary, for example, to remove unwanted materials from the 3-D printed panel or to further define features within a component.

In this conventional situation, the component must be transported between different dedicated machines for undergoing the plurality of different processes. The use of different machines can be time consuming and inefficient, and can add costs to the manufacturing of parts. These costs can increase substantially as production capacity increases.

In an aspect, these distinct functions may be combined into a single multi-aspect machine. In one exemplary embodiment, a single multi-aspect printer (MAP) includes two or more AM features. In other embodiments, the machine may include various subtractive manufacturing (SM) functions. For example, the MAP may incorporate functions performed by a CNC machine. MAP may include a robotic arm coupled to a tool for cutting material from a component on a substrate. The arm may alternatively be configured to receive one of a plurality of tools operable for performing different SM procedures.

The integration of multiple technologies into a single machine can substantially increase manufacturing speed and capacity, while reducing costs of labor otherwise incurred from moving the components and capital used for purchasing dedicated AM machines. Additionally, the combined functionality enables components to be printed in series or in parallel, increasing design flexibility and further maximizing production efficiency. Generally, the AM and SM operations of the MAP may be performed in any order.

MAP may include a single printer having a single print area using multiple print heads, including one or more DMD print heads, operable to print multiple areas simultaneously. MAP may be used to achieve greater versatility and speed in printing 3-D structures. MAP has the capability to set up and implement local PBF processing. MAP may also additively manufacture custom build plates needed for AM operations. In some embodiments, MAP can use DMD to produce "build plate supports" that attach to the printer plates and that support the attached build plate. These build plate supports may be attached below the build plate and can be made to be breakable from the build plate to enable the build plate to become part of the printed structure, if desired.

MAP may further include a robotic arm that introduces a build plate where needed in regions requiring the feature sizes and properties available with PBF. MAP may further include a robotic arm that may be used to introduce a build plate where needed locally in a larger chamber. A robotic coating arm may then coat the build plate and subsequent layers between sintering operations. MAP may further include a vacuum arm for removing excess powder upon completion of operations, allowing DMD onto PBF regions.

In one exemplary embodiment, the print heads may be printed in place by DMD. In another embodiment, MAP may incorporate fused deposition modeling (FDM) print capability including FDM extruders which heat and eject melted filament materials provided from FDM spools for printing thermoplastics and other materials ideal for internal supports and other functions where plastics may be beneficial.

Figure 4:
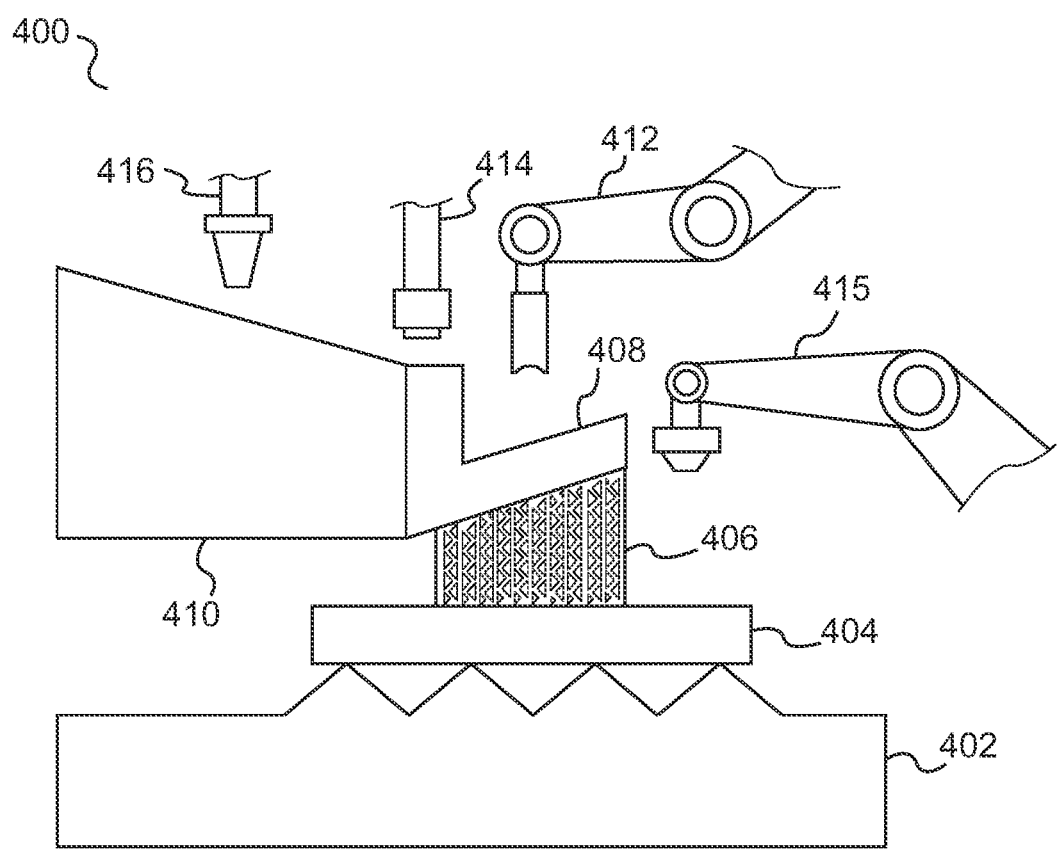
FIG. 4 illustrates a conceptual view of a multi-aspect printer (MAP) in accordance with an aspect of the disclosure.

FIG. 4 illustrates a conceptual view of a multi-aspect printer (MAP) 400 in accordance with an aspect of the disclosure. Referring to FIG. 4, MAP may include, as noted, one or more DMD heads or applicators 416 on a robotic arm assembly for 3-D printing a DMD structure. MAP may further include PBF equipment such as electron or laser beam sources. For example, PBF laser 414 is shown disposed on a separate robotic arm assembly. The PBF equipment may further include deflectors (not shown), a local powder applicator 412 on another robotic arm assembly, and an FDM robotic arm assembly 415. As noted above, in other embodiments more than one print head or applicator may be included on a robotic arm. Alternatively or additionally, more than one robotic arm may include a print head supporting the same technology (e.g., DMD, PBF, FDM, etc.) There may also be a number of different types of PBF technologies employed on one or more robotic arm assemblies (e.g., SLS, SLM, etc.).

One or more of the applicators and robotic arm assemblies of FIG. 4 may be performing operations on a structure which in the embodiment shown includes a PBF structure 408 upon which a larger DMD structure 410 has been formed. The PBF structure 408 may be connected to FDM- and PBF-formed support structure 406 for supporting the PBF structure 408 and DMD structure 410. The PBF structure 408, in turn, is arranged on a local DMD build plate sub-structure 404 which is further supported by a larger DMD build plate support structure 402.

MAP may also include one or more tools for milling. MAP may also use FDM on the top layers of a build piece for surface finishing. Structures for facilitating SM techniques may also be provided, such as automated milling tools and the like.

In some embodiments, MAP may print a structure using DMD and, concurrently or subsequently, add a part with a build plate and an immobile supporting structure. Alternatively, MAP may 3-D print the build plate and then apply a robotic arm containing powder to implement a PBF process while having a laser positioned over the powder bed. The laser may point to a mirror, which can be mobile or stationary.

MAP can have wide applicability to the manufacture of transport structures and other mechanical assemblies. For example, MAP can print lattice panels located in non-crushable areas using PBF or FDM (in the case of plastic lattice panels). MAP can print metal vehicle panels using DMD. MAP can also use FDM to 3-D print support features. In the case of a curved panel, for example, FDM may be needed to print the corresponding lattice structures for supporting the panel. As noted above, FDM can also be used to provide surface finishing to increase quality of the 3-D printed parts. In other embodiments, MAP can 3-D print support materials using a combination of FDM and PBF technologies. These supports can optionally be broken off following the AM process on the object being printed.

In another exemplary embodiment, MAP may include spray form capability. Spray forming is the inert gas atomization of a liquid metal stream into variously sized droplets (10-500 microns) that are then propelled away from the region of atomization by the fast flowing atomizing gas. The droplet trajectories are interrupted by a substrate which collects and solidifies the droplets into a coherent, near fully dense preform. By continuous movement of the substrate relative to the atomizer, large preforms can be produced in a variety of geometries including billets, tubes and strip. The addition of a robotic arm for spray forming provides yet additional versatility to MAP.

Further, as described above, MAP may incorporate one or more SM processes. For example, MAP may include a CNC computer controlled arm for use in accurately removing material or structure where needed.

In addition, MAP may include multiple arms and/or print heads for performing the same AM functions in a faster manner. For instance, MAP may provide a plurality of DMD print heads for performing metal deposition in parallel, or more than one energy beam for implementing a PBF process.

The availability of multiple robotic arms performing unique functions also enables some AM processes to be conducted in parallel. For example, in manufacturing a panel, one section of the panel may be undergoing PBF processing while another section to which PBF techniques have already been applied may simultaneously undergo spray forming. Parts may also be 3-D printed in series, with one process immediately following another without delays associated with mobilizing the component to another printer or another production area.

MAP may be under the general control of a central processing system, controller or computer that executes instructions corresponding to each of MAP's different capabilities. The processing system may be operable to integrate these instructions together to provide a meaningful sequence of instructions that incorporate a plurality of MAP's capabilities into one overall manufacturing operation. In other embodiments where desired, MAP may include a number of modes for using individual AM or SM technologies. For example, MAP can be used in FDM printing mode to additively manufacture a plurality of exclusively FDM-based objects. To accomplish this objective, the processing system may, in general, include a variety of processing modes whereby different capabilities of MAP are exploited for specific applications. These modes may also include specific modes that utilize a plurality of MAP's features concurrently, where desired for efficiency or as an inherently-desired aspect of rendering a particular object.

The capability to additively manufacture parts enables the manufacturer to generate shapes, configurations, and structures that are not available in conventional manufacturing processes. Further, advances in AM technologies are expected to continue. Print speed is continually increasing. 3-D printer form factor has also seen regular advances. This means, among other things, that the area of the build platform as compared with the size of the component to be printed is becoming progressively larger as relevant as build plates and printer profiles cross unprecedented boundaries in size, speed and sophistication. The availability and suitability of candidate materials and chemical compounds for use in AM is likewise increasing, meaning among other things that the versatility of AM should continue to impact other applications and other parts of the transport structures.

In one aspect of the disclosure, complete transport structures are additively manufactured. For the purposes of this disclosure, AM techniques with automobiles are used to demonstrate the capabilities of these advanced manufacturing techniques. However, using substantially similar principles as outlined in this disclosure, practitioners skilled in the art will recognize that analogous patterns and identical principles can apply with equal force to numerous classes of transport structures—planes, trains, busses, boats, snowmobiles, motorcycles, and aircraft to name only a few.

In other aspects and exemplary embodiments, a vehicle assembly system is disclosed having a recycling and replacement system which is built right into the infrastructure of the vehicle assembly plant. In still other aspects, innovations in transport structure manufacturing are discussed and in particular, unique techniques for modular design and manufacturing are introduced in the context of AM. Following logically from the AM techniques in the advanced and ultra-efficient design of the modern automobile, still other advanced manufacturing objectives may be achieved.

Modularity.

In some exemplary embodiments, the design and manufacture of the transport structure may be modular in nature. Modular vehicles are those that are assembled by joining multiple discrete systems together to form one vehicle. Unlike conventional vehicles, modular vehicles provide the freedom of customizability. Complex parts and consoles can be removed easily, both for functional and aesthetic purposes, and new parts and consoles can be added in a straightforward manner. Because AM technologies not tooling intensive, AM can be used to facilitate the development of modular systems by efficiently fabricating a variety of customized designs that maintain pace with customer requirements and demand.

AM also provides modularity processes with the capability to define and build complex and efficient interfacing features that define partitions or borders between modules.

These features can include indentations, tongue and groove techniques, adhesives, nuts/bolts, and the like. A further advantage of implementing a modular design for vehicles is ease of repair. Modular designs ensures easy access to virtually any component in the vehicle. In the event of a crash, the affected modular block simply can be replaced. The block(s) can also be co-printed with the remaining structure to save assembly time. The blocks can even incorporate in-situ scanning and observation to ensure accurate joining and repair of the modules.

Modular design of vehicles can be considered in some limited respects like Lego blocks. Additive manufacturing technologies provide customers with the opportunity to customize virtually every block. For the installation of a higher performance powertrain, the old one is removed and the new powertrain is installed by connecting it at the appropriate interfaces to the rest of the vehicle. Exterior panels may be easily changed as well, which in turn provides the ability to change the overall appearance of the vehicle.

Vehicle manufacturing and operation can become extremely efficient using the above-described modular techniques. Users may keep their vehicles for a longer time, since they have the option of customizing vehicle appearance, systems and performance at any point. The backbone of the vehicle may remain the same, while new systems replace old ones. Interior consoles can just be extracted from the vehicle to make room for new, advanced consoles to be plugged in. The mounts for these consoles would be 3-D printed, and it would be easy to match the connection ports with the modules.

The modules that are replaced or damaged can be recycled to recover raw material for use in the AM process. Because entire parts are additively manufactured, there is minimal loss of material during the recycling process. The recycled material makes its way into the 3-D printers to manufacture newly-minted parts. These types of capabilities in recycling substantially all of an old part may significantly increase the efficiency and flexibility of corresponding relevant facets of the auto industry.

Using a modular design approach, the AM vehicle may be assembled as a collection of 3-D printed and non-printed components integrated together via some interconnection means for attaching the components at defined borders or transitions as noted above. Individual components may be added and removed without requiring changes to other components of the vehicle. Using a modular approach, the vehicle may be considered as a replaceable collection of assembled parts connectable into a functional transport structure via standard interconnects.

Modularity as described herein includes embodiments where the vehicle frame (e.g., the endoskeleton), body, and integrated components may be co-printed, where the co-printed parts making up the vehicle may further constitute an arrangement of smaller substructures. Assembling a vehicle in which the pieces are modular in nature provides numerous additional advantages. As noted above, the frame and other portions of the vehicle may be defined by a plurality of constituent parts coupled together using one or more interconnect features. Such interconnect features may include nuts and bolts, screws, clamps, snap-in engagements, or other mechanical attachment mechanisms. The modular components may also include perforations, depressions for accommodating drilling, tongue-and-groove connections or other male-female interconnects, and reattachment mechanisms defined by bolt holes. In some cases adhesives may be desirable. The structure, including the frame, may be co-printed in a manner that can enable separation and recovery of the constituent modular parts.

In another embodiment, the entire frame of the vehicle (and optionally other parts integrated within the frame) may be printed in a single pass or in a few renderings. Smaller parts of the frame may be printed if the frame is further subdivided into smaller modules. Such a modular frame structure, in certain embodiments, can make it easier to access parts of the vehicle underneath the frame.

The modular approach described herein provides a number of advantages over existing approaches. A non-exhaustive list of such advantage may include, in summary:

1. Design and Manufacturing simplification. The entire process of designing and manufacturing transport structures can be simplified and streamlined using AM techniques coupled with modular designs. Generally, the cost and time associated with 3-D printing the vehicle and its constituent components, and integrating and assembling the components into the vehicle, are far less than those associated with conventional machining processes involving largely customized designs and dedicated manufacturing infrastructures (e.g., assembly lines dedicated exclusively to producing individual models of transport structures).

2. Integration of printed versus non-printed components. 3-D printing the vehicle in modular sections also allows the manufacturer to define transitions between printed components and any non-printed components during the design process. The vehicle can then be assembled using these transitions such that non-printed components may treated as modular segments like the printed components. This facilitates the ease of later repair and replacement procedures affecting individual components, including non-printed components within the vehicle.

3. Availability of simple to complex components. Manufacturing approaches that produce parts primarily through conventional machining and tooling techniques are limited by the allowable complexity of components, especially for a given price range. Conventionally, vehicular components based on sophisticated designs require use of custom molds and added manufacturing steps, which can increase cost. Using 3-D printing techniques, complex and sophisticated shapes that are otherwise impractical or impossible to produce using conventional machining techniques may be achieved easily and in a cost effective manner using modular designs and additive manufacturing. Further, the complexity and sophistication of overall designs may be broken down into individual components that can be managed more easily than for larger components covering a variety of functions.

4. Interchangeability of components. After the vehicles are sold, parts may be upgraded to incorporate newer features or added functionality. Regardless of the complexity of the component, the use of AM enables the component upgrades to be produced in a straightforward manner and easily assembled into the vehicle by removing the old component and assembling into place the new component using standard interconnect mechanisms. In some embodiments, the assembly of the new components may be made simple using "snap in" techniques or other interconnects designed specifically for ease of interchangeability. The combination of replaceable components that have standard interconnections (including interconnections available for electrical conduits, fluid transfer, and other complex features) facilitates ease of interchangeability. A user of the vehicle may acquire upgrades to the vehicle without having to incur expenses for labor associated with custom interconnections and significant alterations to other, unrelated parts of the vehicle.

5. Ease of repair. The modular design of the vehicle simplifies repairs for parts degraded due to wear and tear or damaged in an impact event. Conventionally, when a vehicle is involved in a collision affecting a certain subset of components, the repair process requires the replacement of additional components beyond the affected components. These replacements for otherwise unaffected components, such as vehicle panels and node sections, drive up repair costs. This is because in conventional vehicles lacking modular features, individual components are often constructed as a single large and inseparable component incorporating a variety of potentially unrelated features. In other instances, these individual components are often linked to adjacent components in a manner requiring all such components to be replaced wholesale if any one of the individual components is damaged. For example, if a single side panel is compromised during an accident involving a conventional, non-modular vehicle, adjacent panels that are inseparable from the damaged side panel may also have to be replaced. Using modular designs, by contrast, only the side panel that was affected need be replaced, leaving adjacent panels unaffected. In sum, if one module of the vehicle gets damaged, a replacement module can be provided, and the vehicle repaired, simply by replacing the damaged module with a new part.

6. Outdated or discontinued components. In the manufacturing industry, parts may become outdated and obsolete. This may substantially limit the options for a vehicle owner requiring an obsolete part to effectuate a repair process. If the part is no longer produced, especially as in the case with custom vehicles or less popular models, the part may need to be re-manufactured from whole cloth using traditional tooling. By contrast, the modular nature of the transport structures described herein means that outdated or obsolete components, however sophisticated or unique, can simply be 3-D printed based on the original CAD data model. The part can then be assembled into the vehicle.

7. Upgrades: changing look and feel. Beyond the repair and replacement process for damaged or affected parts as described above, modularity more generally provides ease of customization of the vehicle for the owner. This customization includes changing the look of the vehicle. Existing multi-panel assemblies can, in one embodiment, be replaced wholesale with newer AM structures. Newer and more modern panels can be constructed and assembled via simple interconnects to replace older panels. Such panels and related structures can have designs that range from trivial to sophisticated and complex. Regardless of the complexity of the underlying parts, modularity enables potentially significant changes to the vehicle's appearance at a manageable cost.

In addition to aesthetics, an owner may elect to increase performance of the vehicle by replacing the engine or other such parts. The capability of AM together with use of modular components as applied to the engine, transmission, drivetrain, and other performance-related structures facilitates the ease of performance upgrades in much the same manner as upgrades for aesthetic purposes.

In short, using the AM capabilities and modular construction techniques as described, 3-D printed vehicular components can be easily manufactured, and later reprinted and replaced as necessary. Repair and replacement is made possible for parts regardless of their complexity or of their current availability in inventory. Custom modular panels and other parts having a unique shape may be manufactured and assembled into an AM vehicle. Unlike conventional techniques in which adjacent parts of the automobile need to be replaced as well if one part is damaged during an impact, the parts to be replaced using the techniques herein may be limited to those that were affected by the impact.

It will be appreciated that in other embodiments, panels and other parts having modular features are not limited to being 3-D printed, but may also be constructed using other techniques, including the use of tooling or molding techniques, or other non-AM techniques, where necessary or desirable. Conversely, it will be appreciated that in still other embodiments involving specific conditions or manufacturing criteria, certain AM parts need not be defined by modular features.

In an exemplary embodiment, an AM structure may function as an exoskeleton based frame designed to enclose an exterior vehicle surface and accept operational loads. The transport structure may include a set of general components, which may include part or all of the set of vehicular components that, together with the AM structure, collectively make up the transport structure. The exterior surface of the AM structure may include a plurality of cavities for housing components that use an external interface.

In an exemplary embodiment, the set of general components may include components that are integrated in part or in whole within the AM structure. The set of general components, for example, may include at least a subset of components that are internal to the AM structure, and a subset of components that are integrated in part within the AM structure and that use an external interface. In some embodiments, the set of general components may also include components that are not necessarily integrated within the AM structure but that are attached or appended, directly or indirectly, to the AM structure.

In other embodiments, a plurality of components may include components that are internal to or reside interior to, in part or in whole, an AM structure, such as an exoskeleton-based frame structure including an exterior vehicle surface, as well as components that are partly interior to the frame and that use an external interface.

Figure 5:
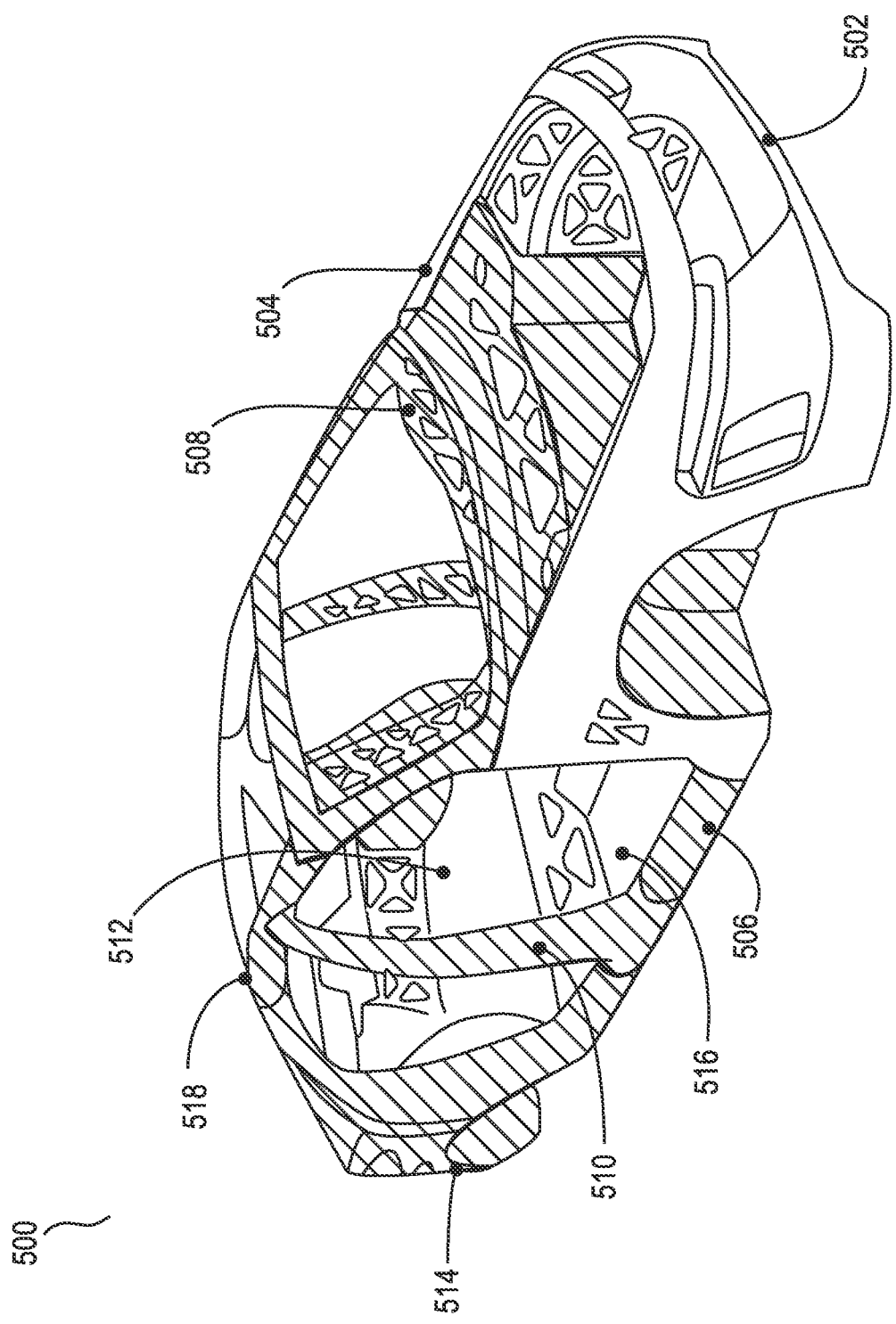
FIG. 5 illustrates a perspective view of a vehicle additively manufactured (AM) in accordance with an aspect of the disclosure.

FIG. 5 depicts an exoskeleton-based frame structure for a vehicle model 500, in which one exemplary embodiment of a broad AM strategy may be presented. The exoskeleton frame is discussed in greater detail with respect to FIGS. 5 and 6. FIG. 5 illustrates that in one exemplary AM embodiment, simple "box" sections of the vehicle may be replaced with extrusions, while large shear panels may be replaced with honeycomb panels. Thus, in the example of FIG. 5, a front clip module 502 may be identified that incorporates a cooling module, bumper beam, hood latching, lamps, and other components associated with these functions in the general area of the vehicle front. A model of the front clip module 502 may be designed and stored in a database and its relationship with other modules subsequently examined. An impact structure 504 may include a one piece wheelhouse, fenders and proximate crash structures. When recording the impact structure 504 as part of the model, the designer can continue to specify modular relationships for later integration of the vehicular model 500.

Extrusions 506 may be used to span areas on the vehicle incorporating simple, straight, constant sections of material. In an embodiment, the extrusions 506 are 3-D printed. More generally, any of the parts or components that are non-printed may, in other embodiments, be 3-D printed. In addition, dash & windshield frame module 508 is disclosed. A modular dash & windshield frame module 508 may ideally identify a single piece dash and windshield aperture for providing optimal structural performance, dimensional accuracy and design flexibility. Thus, in this example, module 508 may be treated and installed as a single, complex module incorporating the identified dash and frame.

B-Pillar module 510 may include, for example, a single piece printed box section incorporating a large section of hardware characteristic of that portion of vehicle 500. For example, B-Pillar module 510 may include hinges, striker, seat belt mounts, and other equipment associated with the side portion of the frame and the front passenger seat. Rear Floor module 512 may incorporate printed 'X' members and rear suspension mounts. Similarly, C-Pillar & Rear Quarter module 514 may embody features similar to B-Pillar module 510 but for the rear right portion of vehicle 500 adjacent the wheelhouse. Back light aperture 518 may frame the backlight and complete the roof structure. For hatchbacks and vans, this feature may become the tailgate aperture, which may incorporate hinges and strikers. It will be appreciated that vehicle 500 may be partitioned in different ways depending on the ease of integration, dependence of module features on other features, the characteristics and build plate size of the 3-D printer involved in the AM process, and preferences of the programmer.

Because Main Floor module 516 in this example represents a large planar array area, module 516 may include, for example, composite honeycomb shear panels which in many embodiments are used for such large planar areas. It should also be noted that, depending on the size of the 3-D printer and corresponding build plate, the exoskeleton-based frame in one exemplary embodiment may be printed in a single rendering. Alternatively, like the other components, the frame may be printed as a series of modules, particularly if the size of the build plate and AM geometry is smaller than the array defined by module 516.

Exoskeleton Vehicles.

Exoskeleton vehicles are those whose exterior surfaces provide the needed structure. The exoskeleton is designed to sustain the majority of operational and structural loads on the vehicle and to protect the passengers during a response to an impact event. Like a conventional frame, an exoskeleton frame may include cavities for accommodating an external interface (namely, cavities and other sections for fitting windows and other systems including headlights, HVAC systems, and the like). As described further below, the exoskeleton frame may include custom honeycomb panels or similar reinforcing structures for providing support in the event of an impact. In these embodiments, the vehicle frame rails can be eliminated.

The use of exoskeleton frames also provides the capability to modify the materials in specific areas of the frame to provide further support. For example, to protect occupants in the event of a frontal impact, internal support material within the frame can be made softer to absorb energy. Plastic materials that are 3-D printed using FDM may be used for this purpose.

To meet pedestrian impact requirements and to protect a pedestrian in an impact event, the exoskeleton frame can be composed of structures made to be thinner, weaker, or out of different materials (e.g., plastic) in the relevant regions of the vehicle. For example, the hood, or portions thereof, can be structurally designed to be thinner or weaker, and can be made of plastic parts to enable it to deform upon impact. In regions away from the pedestrian protection zone, these characteristics may be unnecessary and the frame can consequently be made stronger.

In an embodiment, a section of the panel can be made to deform or crush in a vertical direction or other direction maximizing pedestrian protection, wherein that same section can be made much stronger in a longitudinal direction. Composites having directional strength properties, such as carbon fiber, may be suitable for this purpose.

Figure 6:
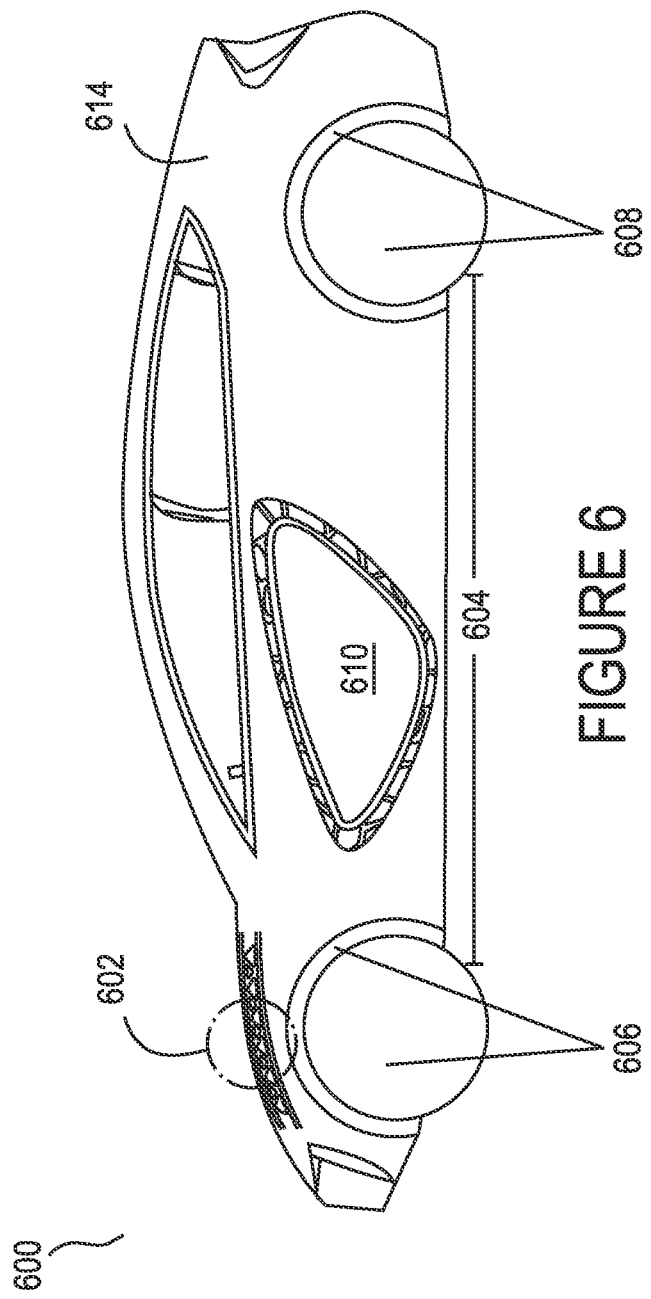
FIG. 6 illustrates a side view of a vehicle additively manufactured with an exoskeleton frame and having a transparent and cutaway portions for revealing internal structure.

FIG. 6 illustrates a side view of a vehicle 600 additively manufactured with an exoskeleton frame and having transparent and cutaway portions for revealing frame structure. Using AM, the vehicle can be designed like the fuselage of an aircraft. That is, the exoskeleton frame 614 can be constructed with a smooth exterior to account for superior dynamic performance on the A-side. By contrast, the structure and ribs of the exoskeleton frame would be arranged on an interior B-side. FIG. 6 also shows that the front and rear interior space 606, 608 of the vehicle can be may be made along the line 604 using the exoskeleton frame. This additional length 604 is due to the strength of the exoskeleton frame and its ability to handle operational loads and random forces.

Figure 7:
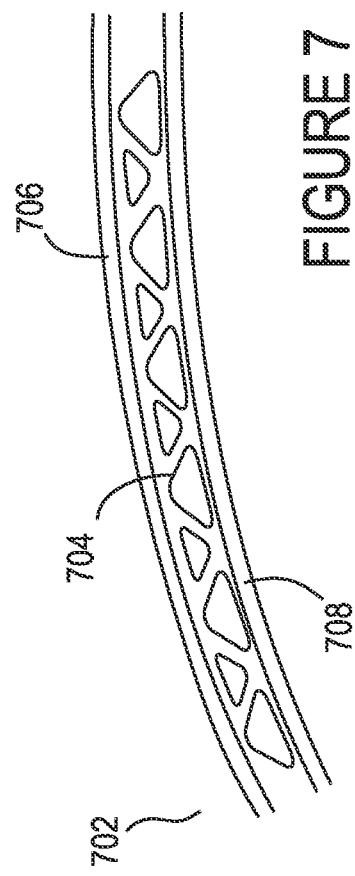
FIG. 7 illustrates a side-sectional view of a contoured sandwich panel from the exoskeleton frame of the vehicle of FIG. 6.

Additionally, while printing exoskeleton based transports, free spaces can be printed that include matrix arrays filled with lattices. This configuration provides both structural support and weight savings. FIG. 7 illustrates a side-sectional view of a contoured sandwich panel 702 from the exoskeleton frame 602 of the vehicle of FIG. 6. It should be noted that the cutaway section 610 of the exoskeleton vehicle has a skin with similar properties. More specifically, cutaway section 610 can be seen to include an inner and outer skin as well as a lattice structure interspersed therebetween.

Referring back to FIG. 7, sandwich panel 702 includes an outer skin of the vehicle composed of cross-sectional layer 706 and an inner skin composed of material 708. These two layers may include a honeycomb/lattice structure 704 between them that in one embodiment covers the entire area of the transport. Generally, the distributed strength of sandwich panel 702 obviates the need in various embodiments for frame rails on the vehicle such as front and rear bumpers.

Further, another advantage as indicated above of this strong skin disposed about the periphery of the transport is that the wheelbase distance 504 (FIG. 6) can be generally made longer. Generally, in these exemplary embodiments, the skin (i.e., the exoskeleton) bears all the load by virtue of the ability to use the custom-formed honeycomb panel. As a result, in some embodiments, frame rails may be altogether eliminated.

In one exemplary embodiment of FIG. 6, exoskeleton vehicles may have one or more coatings sprayed over the surface to protect and impart a degree of smoothness to the surface. In an embodiment, FDM, or another AM technique, can be used for this purpose. This procedure may be in lieu of attaching outer panels around the surface of the exoskeleton frame and enables significant weight savings. In regions of the vehicle where surface roughness is a requirement, such as in heat transfer applications in which an increased surface area may be used to dissipate heat, these features can simply be represented in the input model for the module and AM can easily integrate such features into the exoskeleton to impart the required roughness to the surface. Stated differently, the use of AM according to this embodiment obviates the need to perform a post-processing step to impart surface roughness to the exoskeleton frame.

With reference again to FIG. 7, monocoque carbon fiber frames are sometimes used in which dual sheets of carbon are arranged with a honeycomb of paper in between. This skin configuration, however, is very expensive as well as labor intensive. In particular, the skin is produced not by AM but rather it is laid up with a tool and vacuum bagged. This configuration, moreover, is inferior in terms of energy absorption capability when compared to metal. For these reasons, in an exemplary embodiment, the skin 702 of the exoskeleton frame is a 3-D printed metal, and in view of its excellent predisposition to absorbing energy, the metal skin 702 is configured to absorb a significant majority of the energy from accidents or rough riding scenarios, if not the entire load. The skin 702 in alternative embodiments may be composed of plastic materials, composite materials, or a combination of different materials. For example, in embodiments involving lower total operational loads and/or collisional risks, carbon fiber or other composites may be substituted in place of the aluminum loads.

As discussed above, the exoskeleton frame may be designed to deform or give way when impacted. For example, in an impact on the hood from above, the internal lattice structure may be configured to collapse. Conversely, when struck in a longitudinal direction in a forward vehicle impact, the frame may be designed to absorb the energy and maintain its structural integrity.

It should also be noted that, while the honeycomb or lattice structure sandwiched between the two layers provides additional reinforcing support without imposing dramatic increases in mass, in some embodiments the honeycomb structure may be omitted in certain regions. That is, honeycomb/lattice supporting structure can in some cases be omitted from certain regions of the vehicle in specific embodiments.

The benefits of using AM in the context of the above examples include the absence of any need for custom tooling or a factory footprint. AM makes it possible to print multiple types of vehicles or transports using a single 3-D printer. Ideally, the particular 3-D printer chosen would only need a sufficient printing resolution to enable printing of Class-A surfaces directly without the need for post-printing operations. AM technologies with high resolutions make it possible to print parts with extremely complex geometries, yet with smooth surfaces on the Class-A side.

Subject to the possible exceptions above, in the vehicle embodiments directed to the exoskeleton structure, the main structure of the vehicle is additively manufactured in the form of honeycomb panels over substantially the entire surface of the transport. These panels in turn handle the road loads associated with driving as well as the impact loads from a collision.

In another exemplary embodiment, the walls of the transport are carefully and methodically arranged to incorporate more efficient structure (e.g., structures having lighter weight and using fewer materials) where it is needed and conversely, to incorporate strength in other areas where strength is paramount.

Figure 8:
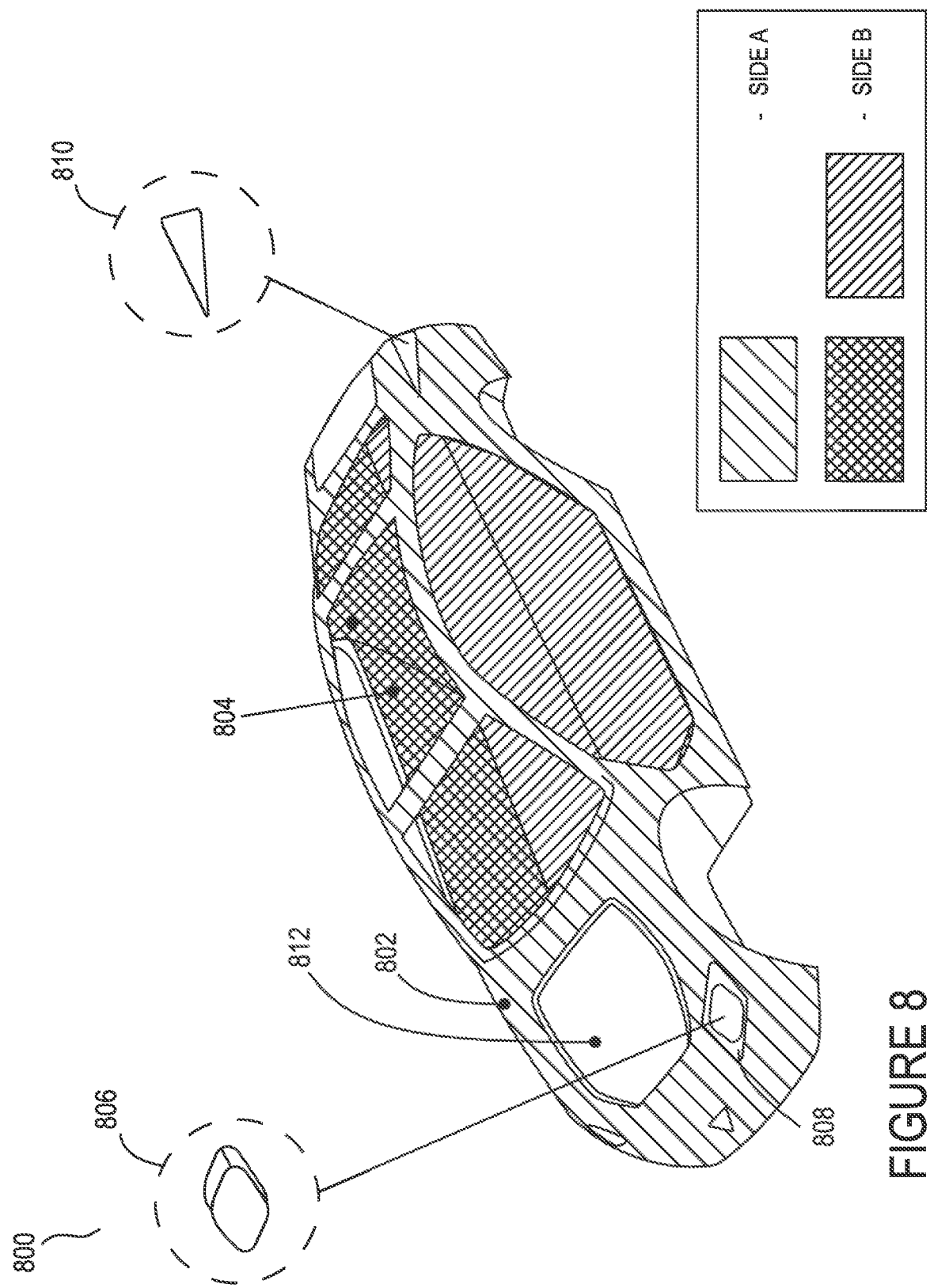
FIG. 8 illustrates a perspective view of an AM frame having cavities for mounting components having an external interface.
Figure 9:
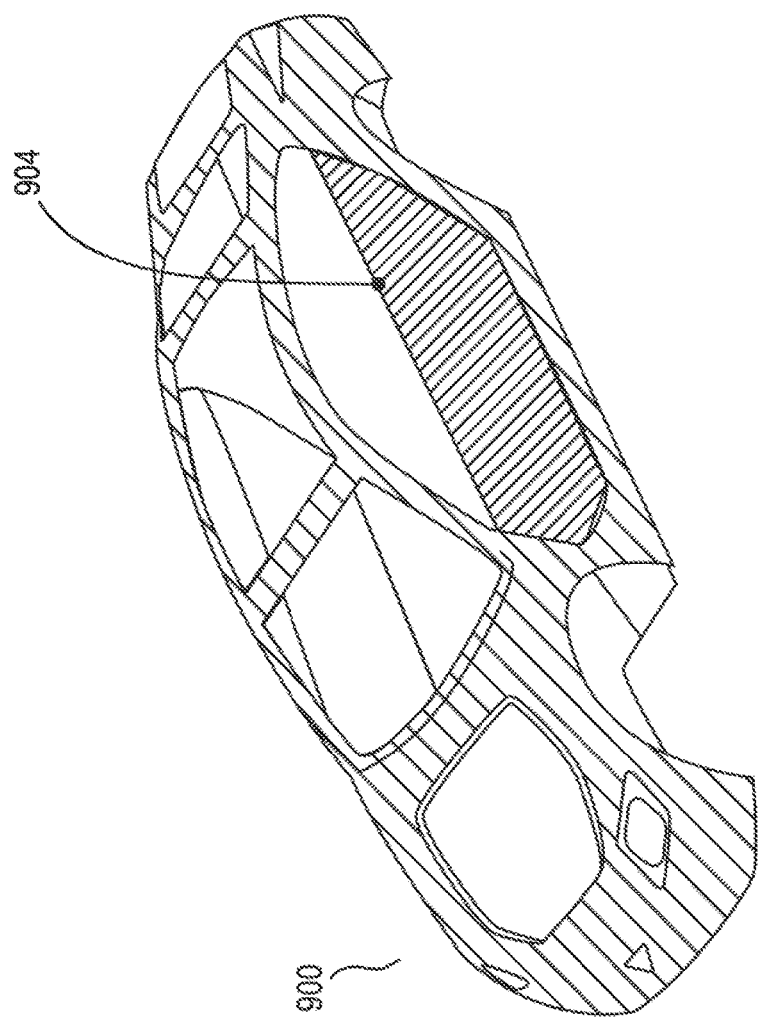
FIG. 9 illustrates another perspective view of an AM frame.
Figure 10:
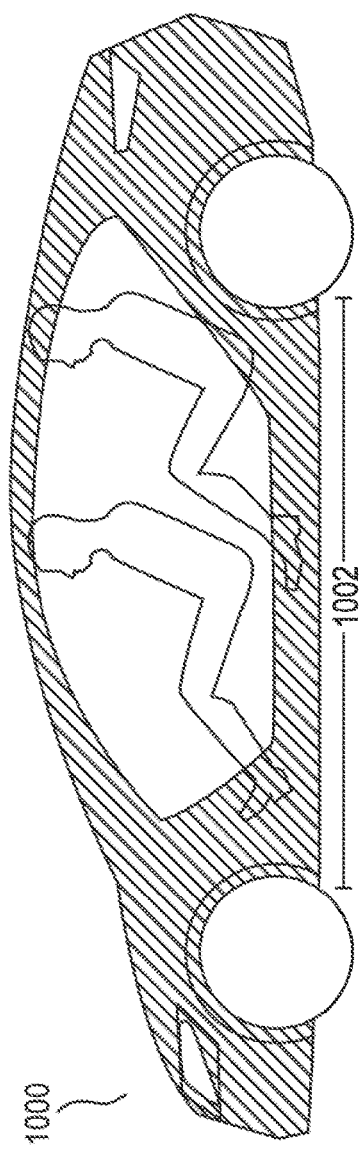
FIG. 10 illustrates a side view of an AM vehicle having a structural outer sandwich skin, enabling improved aerodynamics by eliminating the need for external frame rails.

FIGS. 8-10 illustrate various embodiments of an exoskeleton based vehicle. Referring to FIG. 8, the exoskeleton frame 800 includes an aircraft style exterior shell 802. Because the frame 800 is equipped to be modular with a plurality of autonomous regions, it tends to avoid being crushed and avoids all out crashes where a significant portion of the frame 800 would be destroyed. In addition, while the external Class-A side exhibits smoothness, structure can reside on the B surface. The entire vehicle, including frame 800, can be 3-D printed with apertures to receive headlights 806, tail-lights 810, and HVAC systems. Brackets can also be inserted into aperture 808 for connecting to the headlights 806 housed in aperture 808. A hood can be housed in aperture 812. The lights and other vehicle systems can themselves be 3-D printed, and would be configured to fit into these openings to ensure excellent aerodynamic characteristics with aesthetic appeal. Using the modular layout technique, various vehicular systems could simply be integrated at specific connection points. In other exemplary embodiments, electric circuits can also be printed into the exoskeleton frame 800, thereby resulting in the vehicle base being in a solid state and eliminating the need for complex and cumbersome wiring/harness mounting strategies associated with conventional manufacturing.

The frame 900 of FIG. 9 shows a similar embodiment, showing that the structure 904 can include ribs and lattice structures on the B surface (inside the vehicle), while the A surface (outside the vehicle) remains smooth. FIG. 10 shows an integrated vehicular structure made possible through vehicle frame 1000. As can be seen, the integrated structure allows for a maximum opening for the positioning of vehicle occupants. The stronger skin due to a frame reinforced with ribs and lattice structures can, for example, allow for a longer distance 1002 from the front wheels to the back wheels to provide additional room for the occupants.

Componentry Integration.

In another aspect of the disclosure, the AM model of the exoskeleton frame includes a plurality of cavities and apertures for housing components that require a vehicular external interface. These components may be a subset of the overall group of components that are an integral part of the transport and assembled and integrated into the transport. These components may also be configured to be modular as discussed above, such that damage to one of the components does not reflect a need to repair or replace unrelated component. In one embodiment of exoskeleton-based transports, the rear surface of the vehicle and greenhouse may be exposed. One advantage of using AM to manufacturer such structures is to leverage the flexibility of design and geometry afforded by AM. Panels may thereupon be installed, as part of the AM process or otherwise. Glass may be installed in the greenhouse cavities.

Interior door panels and similar structures in this embodiment would be configured to fit the cavities or sections of the exoskeleton that were 3-D printed. Such cavities can have strategic locations for easy access. Instrument panels, HVAC units, lighting modules and other components for integration can be 3-D printed as well, after which they can be plugged into the matching sections as a straightforward insertion of a known component in an accessible position. As noted above, one principal advantage of this assembly technique is that it may facilitate straightforward repairs and replacements of modules and systems requiring service.

This procedure is in stark contrast to the challenges of subsystem management present in conventional systems, in which facilitating access to specific subsystems for purposes of installation or repair may not be straightforward. One example of a classic shortcoming in transport structures relates to lighting systems. Conventional transports include instruments and lighting that may be designated to fit into the transport with little, if any, regard to ease of access, meaning for example that other subsystems may present obstacles to the installation, or that the frame is not simply not amenable for easy integration with lighting and other components. The problem may be exacerbated if the various instruments having different functions are combined with one another and/or have unique or difficult external connections.

Oftentimes the sheer amount of time to remove and replace instruments subject to these undesirable locations, painstakingly complex wiring profiles, and other obstacles, is so economically inefficient that practitioners opt instead to replace a much larger portion of adjacent working components to enable an easier repair. In contrast to this not uncommon scenario, AM provides adaptability. That is, by designing an architecture that provides easy access to almost every component in the vehicle, reparability becomes easier and less expensive. Automated transports having a modular layout facilitate easy, almost seamless reparability as compared with conventional vehicles.

Another exemplary embodiment involving AM exoskeleton structures is to specify the model design of a portion of the structure such that the exoskeleton is on the outside and the panel inlays are on the inside. The exoskeleton is sealed in this manner. Significant weight savings may be achieved as exterior panels in this embodiment are eliminated. These transports may have excellent crash absorbing abilities because appropriate crash-absorbing features with ideal geometries may be 3-D printed on the outside of the transport. Such results are incredibly difficult to achieve using conventional manufacturing techniques.

Figure 11:
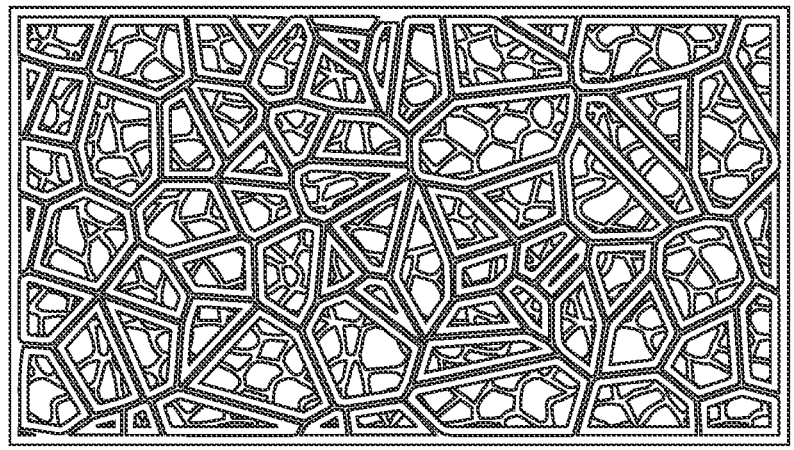
FIG. 11 illustrates panels shaped in Voronoi patterns for assembly with an AM frame of a transport structure.

In another exemplary embodiment, the entire structure can be 3-D printed with interior features based on the model of the 3-D exoskeleton, as before. This time, however, the entire structure can be 3-D printed to accept panels. In one embodiment, the panels can be printed as an integrated structure with the frame. The printed panel sections could resemble Voronoi patterns or other patterned features. An example of a Voronoi pattern 1100 is shown in FIG. 11.

Figure 12:
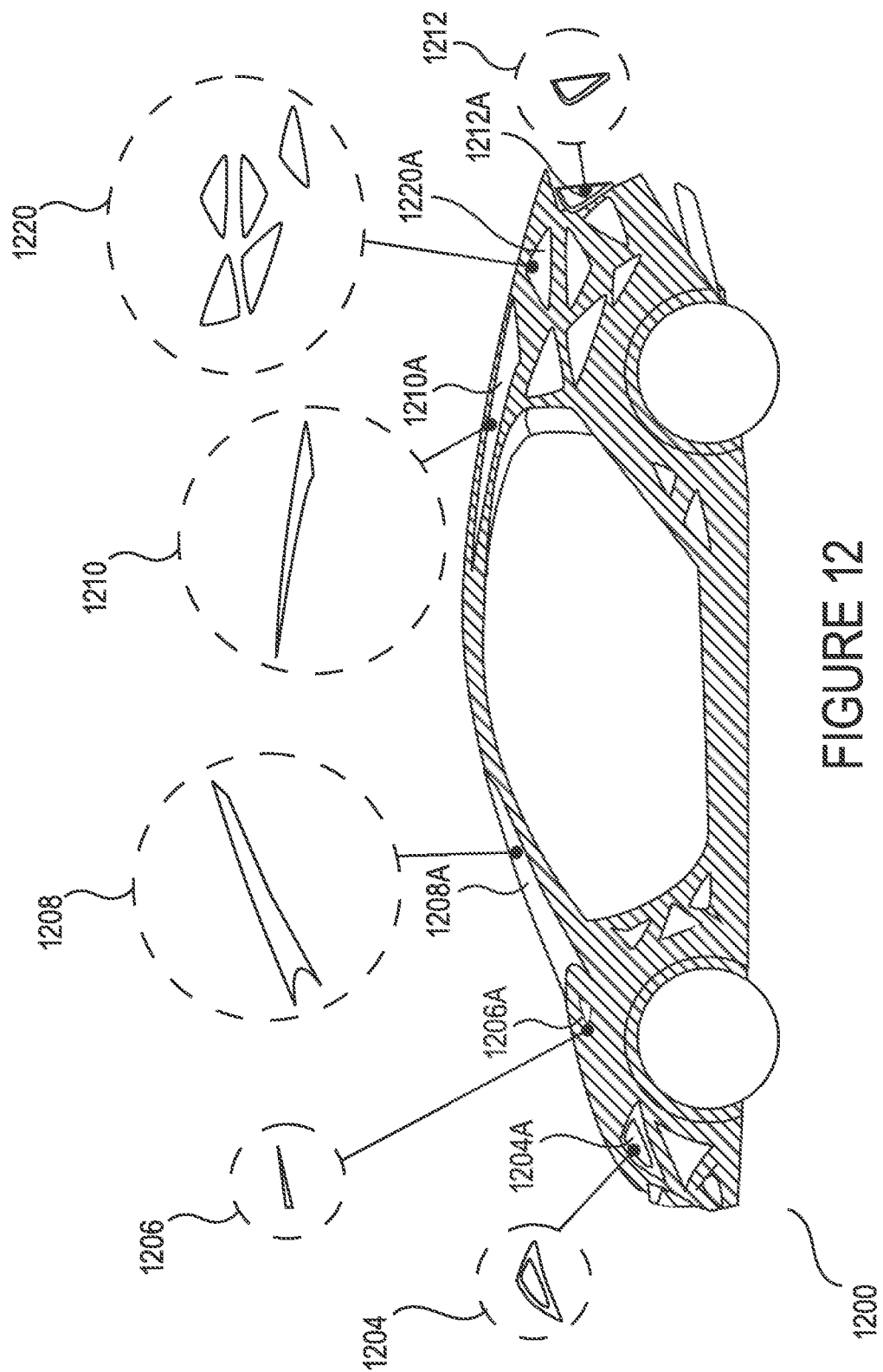
FIG. 12 illustrates a side view of an AM vehicle having crumple zones characterized by a plurality of Voronoi patterns.

FIG. 12 illustrates a side view of an AM vehicle 1200 having crumple zones 1220a characterized by a plurality of Voronoi patterns 1220. The Voronoi pattern, or similar patterns on the transport, can reduce the weight by eliminating solid structures when they are unnecessary, while concurrently improving the structural integrity of the material. These patterns can provide additional reinforcement against impact by serving as discrete crumple zones. Vehicle 1200 represents a printed exterior frame including a plurality of apertures and cavities for serving various purposes. Upon rendering of the exoskeleton frame 1200, a plurality of appropriately-sized 3-D printed components (or in some cases, commercial off the shelf (COTS) parts) are integrated with frame 1200 to form the substantially finished vehicle. Headlamp 1204, windshield wiper 1206, windshield 1208, rear windshield 1210 and tail lamp 1212 may be inserted into their respective cavities 1204a, 1206a, 1208a, 1210a, and 1212a and secured via any suitable attachment means (such as adhesive, bolts, thermal fusion, etc.). The Voronoi pattern of 3-D printed plastic sheets or panels are then fused to their respective cavities 1220a.

It should be noted in FIG. 12 that to avoid unduly obscuring the concepts of the present disclosure, certain steps have been omitted concerning the assembly of the vehicle. One such set of steps is the assembly of the vehicle 1200 from its basic frame. A comprehensive assembly process must ensure that all relevant parts of a plurality of parts are incorporated into the vehicle and functioning normally. These include internal combustion engine, electric motor(s), all electronics, fluid compartments, battery, suspension system, wheel system, spark plugs, braking systems, accelerator, all relevant dash components and a number of other components and subsystems. In an exemplary embodiment, many or most of these parts are additively manufactured. Other sets include the panoply of quality control tests and functional tests to which the vehicle would be subject. A number of steps have been omitted, however, to avoid unnecessarily obscuring the underlying concepts of the disclosure.

In other embodiments, the 3-D printing of the frame, the construction of the mobile transports for moving parts, people and robots to and from the various assembly cells, and the construction of modular components is performed by automated constructors armed with instructions to build the vehicle seamlessly.

The present disclosure addresses key obstacles and provides solutions for a various shortcomings in the art. One such obstacle includes the viability of additively manufacturing a vehicle frame and the limitations on the current sizes of available built plates and 3-D platform geometries for printing. One of multiple solutions to this problem is to include the frame itself as one of the modular subsystems and to reconnect the frame into one cohesive unit after multiple renderings of the individual segments of the frame. The modular design may present easier reparability options for the consumer. As build plates and printer profiles evolve to match or exceed the size of such transports, the manufacturer has the option to decide to maintain modularity of the frame. In some embodiments, the frame can be printed in a single rendering with built in indentations or connections to maintain modularity.

Figure 13:
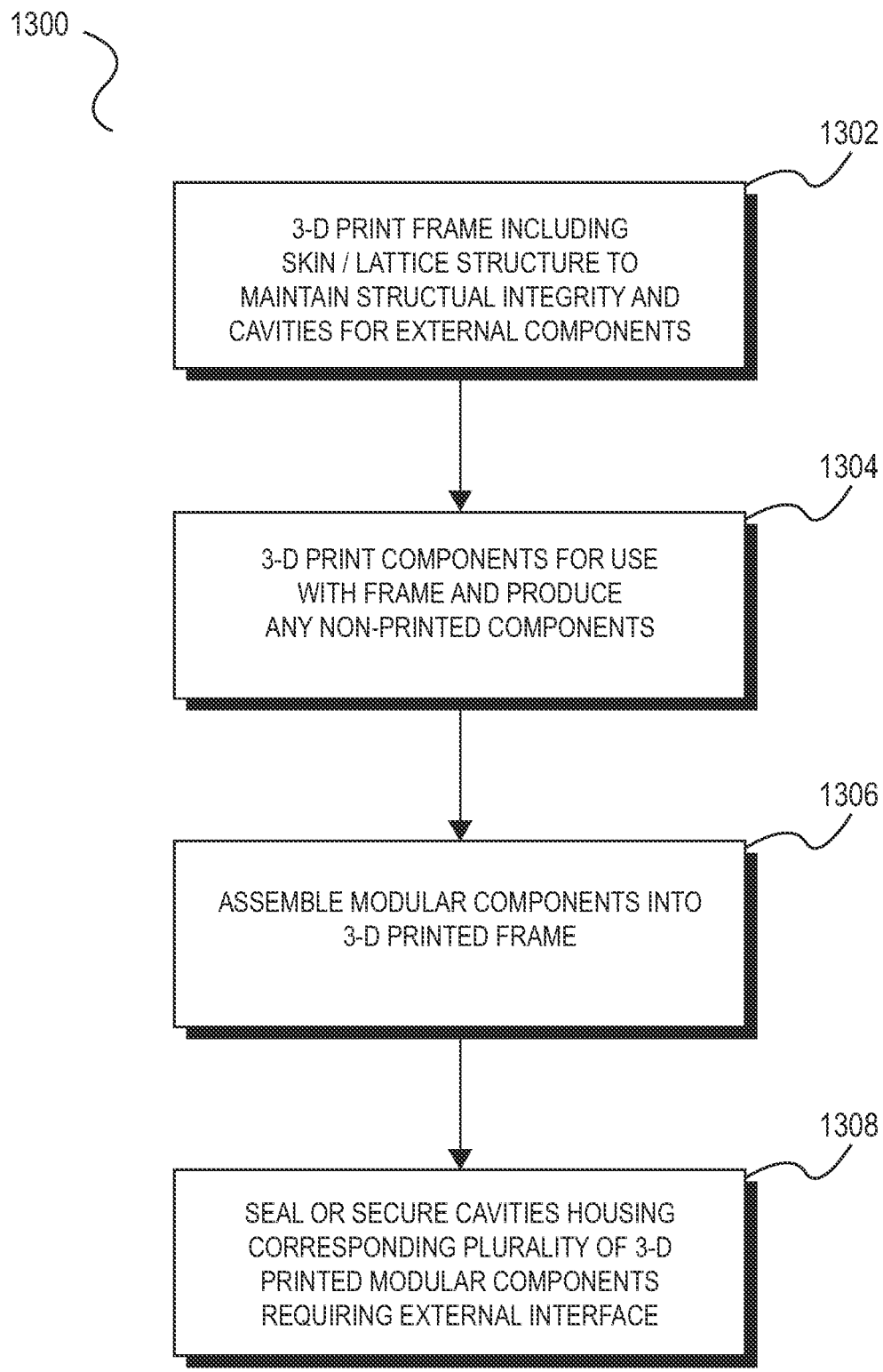
FIG. 13 illustrates a flow diagram of an exemplary method for assembling an AM vehicle.

FIG. 13 illustrates a flow diagram 1300 of an exemplary method for assembling an AM vehicle. At step 1302, the frame may be 3-D printed. The frame includes a structure for accepting operational loads and to protect the occupant in the event of an impact. As discussed above, the frame may be 3-D printed in one or more renderings. The printed frame includes cavities for housing components that require an interface external to the vehicle. In an exemplary embodiment, 3-D printing the frame may including printing interior and exterior panels with a honeycomb structure or other matrix structure between the interior and exterior panels. In some embodiments, the panels and honeycomb structure are co-printed. In other embodiments, one or more the panels and honeycomb structure are 3-D printed separately. In still other embodiments, the panels or honeycomb structure are separately produced using conventional techniques. An outer surface of the exterior panel may be formed with a smooth finish using various techniques, such as FDM AM, or spray forming.

At step 1304, the various components for use with the frame, including those used in the housing, are 3-D printed or otherwise produced using conventional techniques. In other embodiments, the components may be produced using a multi-aspect printer. In still other embodiments, one or more of the components are co-printed with the vehicle frame. Any remaining non-printed components may also be produced in this step. The components or a portion thereof may be modular. At step 1306, the components are assembled into the frame. In an embodiment, after the 3-D printed modular components are assembled into their respective cavities, additional operations may take place as shown in step 1308 to seal or otherwise secure these components in place using, for example, one or more suitable interconnect mechanisms as previously discussed.

Figure 14:
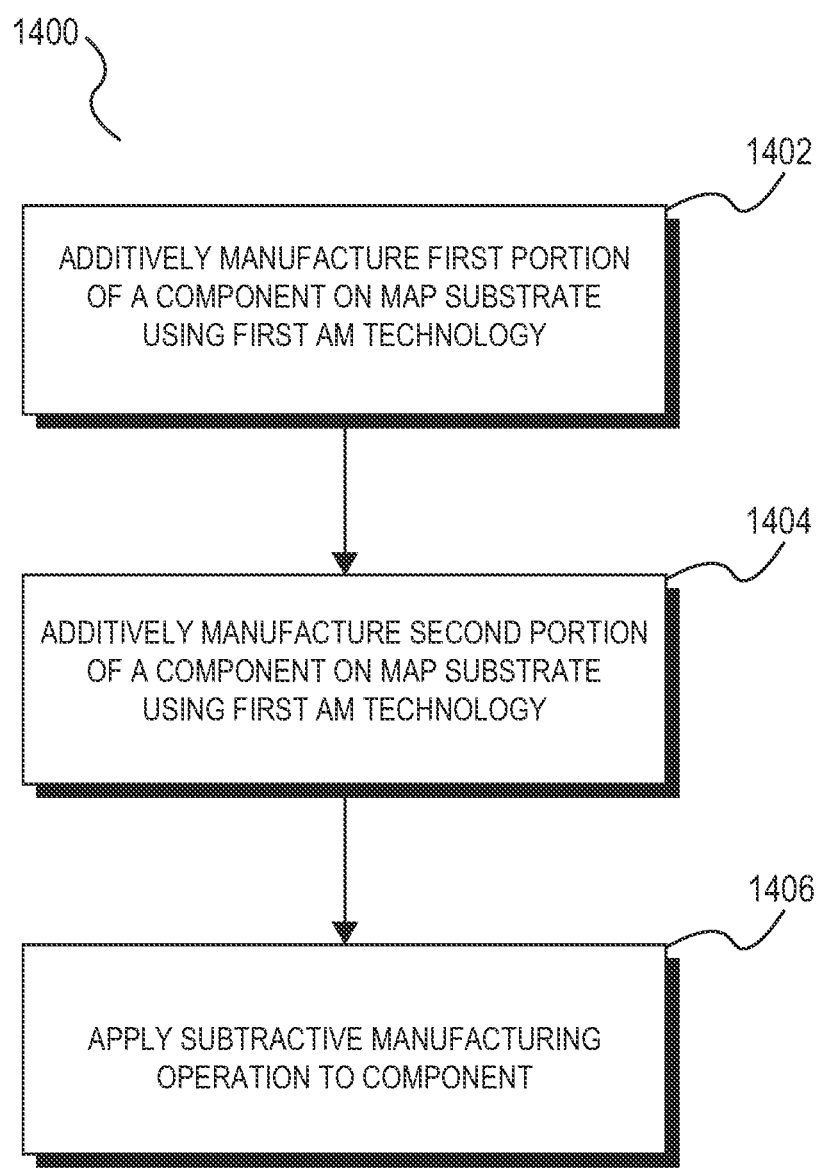
FIG. 14 illustrates a flow diagram of an exemplary method for producing a component using a multi-aspect printer.

FIG. 14 illustrates a flow diagram 1400 of an exemplary method for producing a component using a multi-aspect printer (MAP). At step 1402, a first portion of a component on a substrate of the MAP may be additively manufactured via a first AM technology. For example, a portion of a panel may be 3-D printed using selective laser melting (SLM) or another PBF technology. At step 1404, a second portion of the component on the MAP substrate may be additively manufactured via a second AM technology. In one embodiment, PBF or DMD technologies may be used in step 1402 to produce a metal panel. While one portion or region of the metal panel is being printed in step 1402, another portion of the metal panel that has already undergone 3-D printing via PBF or DMD is being 3-D printed using FDM, for example, to provide a smooth finish. Alternatively, spray forming may be used to provide finishing in step 1402.

The AM steps 1402 and 1404, above, may be performed concurrently (in whole or in part), in series, or in any suitable order. In another embodiment, at step 1406, a subtractive manufacturing (SM) operation may be applied to the component. For example, material may be cut away or removed to produce a hinge. The SM process may be performed by the MAP, and step 1406 may be performed subsequent to the AM operations in steps 1402 and 1404. In other embodiments, step 1406 may be performed in parallel with one or both of steps 1402 and 1404.

The previous description is provided to enable any person skilled in the art to practice the various aspects described herein. Various modifications to these exemplary embodiments presented throughout this disclosure will be readily apparent to those skilled in the art, and the concepts disclosed herein may be applied to other techniques for printing nodes and interconnects. Thus, the claims are not intended to be limited to the exemplary embodiments presented throughout the disclosure, but are to be accorded the full scope consistent with the language claims. All structural and functional equivalents to the elements of the exemplary embodiments described throughout this disclosure that are known or later come to be known to those of ordinary skill in the art are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112(f), or analogous law in applicable jurisdictions, unless the element is expressly recited using the phrase "means for" or, in the case of a method claim, the element is recited using the phrase "step for."

What is claimed is:

1. An apparatus for assembly into a transport structure, comprising:
   an additively-manufactured (AM) structure comprising an exterior surface and an interior surface, at least one of a lattice structure or ribs being enclosed within the interior surface and the exterior surface, the AM structure configured to accept operational loads and to protect an occupant in an event of impact,
   wherein the exterior surface comprises a plurality of cavities for housing components that use an external interface.

2. The apparatus of claim 1, wherein the AM structure comprises an exoskeleton.

3. The apparatus of claim 2, wherein the AM structure further comprises an interior surface.

4. The apparatus of claim 2, wherein the AM structure is configured to provide a majority of impact protection associated with the transport structure.

5. The apparatus of claim 4 wherein impact protection capability of the AM structure eliminates a need for crash rails.

6. The apparatus of claim 2, further comprising one or more greenhouse cavities in a rear portion of the AM structure configured to house panels or glass.

7. The apparatus of claim 2, further comprising door cavities arranged in side portions of the AM structure and configured to house interior door panels.

8. The apparatus of claim 2, wherein the exoskeleton comprises one or more cavities configured to house respective panel inlays in an interior of the exoskeleton to thereby seal the one or more cavities.

9. The apparatus of claim 2, wherein one or more panels are co-printed with at least a portion of the AM structure.

10. The apparatus of claim 9, wherein the one or more panels are assembled using a Voronoi pattern.

11. The apparatus of claim 9, wherein the one or more panels are configured to provide discrete crumple zones operable for structural reinforcement in the impact event.

12. The apparatus of claim 1, wherein the at least one of the lattice structure or the ribs is co-printed with at least one of the interior and exterior surfaces of the 3-D printed frame.

13. The apparatus of claim 1, further comprising a set of general components integrated in part or in whole within the AM structure, wherein the set of general components comprises a subset representing the components that use an external interface.

14. The apparatus of claim 13, wherein at least some of the general components in the set are additively manufactured or are co-printed with the AM structure.

15. The apparatus of claim 13, wherein at least some of the general components in the set comprise modular components.

16. The apparatus of claim 15, wherein the modular components each comprise connection ports configured to couple to or interconnect with connection ports of at least one other modular component.

17. The apparatus of claim 15, wherein the modular components are 3-D printed.

18. The apparatus of claim 1, wherein the components that use an external interface include one or more of headlights, tail-lights and a heating, ventilation and air conditioning (HVAC) system.

19. The apparatus of claim 1, wherein the exterior surface comprises a smooth surface configured to optimize air flow during motion of the transport structure.

20. The apparatus of claim 1, wherein the components that use an external interface include one or more vehicle pillars.

21. The apparatus of claim 20, wherein at least one of the vehicle pillars comprises a modular, additively-manufactured structure.

22. The apparatus of claim 1, wherein the set of general components includes at least one solid state electric circuit printed into the 3-D printed frame and configured to perform one or more functions of an electric harness.

23. The apparatus of claim 1, wherein at least portions of the AM structure are modular.

24. A transport structure, comprising:
   a 3-D printed contoured sandwich panel; and
   a plurality of components assembled in the interior of the sandwich panel including at least one of a lattice structure or ribs enclosed within a first surface and a second surface of the sandwich panel,
   wherein the sandwich panel is configured to support principal structural loads of the transport structure.

25. The transport structure of claim 24, wherein the sandwich panel is contoured to be aerodynamic.

26. The transport structure of claim 24, wherein the at least one of the lattice structure or the ribs comprises a custom honeycomb structure arranged between inner panel surfaces.

27. A method of producing a transport structure, comprising:
   3-D printing a frame having at least one of a lattice structure or ribs enclosed within the frame, the 3-D printed frame comprising a structure configured to accept operational loads and to protect an occupant in an event of an impact; and assembling a plurality of components into the 3-D printed frame,
wherein the 3-D printed frame comprises a plurality of cavities for housing components of the plurality of components that use an external interface.

28. The method of claim 27, wherein the 3-D printing the frame comprises 3-D printing interior and exterior panels having the at least one of the lattice structure or the ribs disposed therebetween.

29. The method of claim 28, wherein the 3-D printing the frame comprising the structure further comprises 3-D printing the lattice or honeycomb structure for coupling the interior and exterior panels.

30. The method of claim 28, further comprising co-printing the lattice or honeycomb structure with at least one of the interior and exterior panels.

31. The method of claim 27, wherein the assembling the plurality of components further comprises co-printing the plurality of components with the 3-D printed frame.

32. The method of claim 27, wherein the components that use an external interface include one or more of headlights, tail-lights and a heating, ventilation and air conditioning (HVAC) system.

33. The method of claim 27, further comprising forming an outer surface of the exterior panel with a smooth surface finish configured to optimize air flow during motion of the transport structure.

34. The method of claim 27, wherein the plurality of components comprise modular components.

35. The method of claim 34, wherein the modular components are 3-D printed.

36. The method of claim 27, wherein at least portions of the 3-D printed frame are modular.

37. A multi-aspect printer, comprising:
a substrate defining a build region;
an applicator configured to provide material for building a structure in the build region; and
first and second processor-controlled arm assemblies configured to extend over the build region,
wherein the first and second arm assemblies are each configured to concurrently perform at least a portion of a function corresponding to a distinct additive manufacturing (AM) technology.

38. The printer of claim 37, further comprising at least one print head coupled to one or both of the first and second arm assemblies.

39. The printer of claim 38, wherein the at least one print head comprises a laser configured for use in a direct metal deposition (DMD) process.

40. The printer of claim 37, wherein the AM technologies comprise at least one of direct metal deposition (DMD), powder bed fusion (PBF), or fused deposition modeling (FDM).

41. The printer of claim 40, further comprising a DMD plate support sub-structure.

42. The printer of claim 37, wherein the AM technologies comprises at least one of Directed Energy Deposition (DED), electron beam additive manufacturing processes using wire stock or powder bed, Single Pass Jetting (SPJ), or Atomic Diffusion Additive Manufacturing (ADAM).

43. The printer of claim 37, wherein the applicator comprises a local powder applicator.

44. The printer of claim 37, further comprising a third arm assembly extending over the build region and configured to perform a function corresponding to a subtractive manufacturing (SM) technology.

45. The printer of claim 44, wherein the SM technology comprises a computer numeric controlled (CNC) machine.

46. The printer of claim 44, wherein the third arm assembly is configured to receive one or more tools for removing material from a structure located in the build region.

47. The printer of claim 37, further comprising a mill substructure.

48. A method for producing a component using a multi-aspect printer (MAP), the method comprising:
additively manufacturing a first portion of the component on a substrate using a first AM technology provided by the MAP; and
additively manufacturing a second portion of the component on the substrate using a second AM technology provided by the MAP,
wherein the additively manufacturing the first and second portions are performed, at least in part, concurrently.

49. The method of claim 48, wherein the first AM technology comprises one of a powder bed fusion (PBF) technology and a direct metal deposition (DMD) technology.

50. The method of claim 49, wherein the second AM technology comprises a fused deposition modeling (FDM) technology.

51. The method of claim 48, wherein the first or second AM technologies comprises at least one of Directed Energy Deposition (DED), electron beam additive manufacturing processes using wire stock or powder bed, Single Pass Jetting (SPJ), or Atomic Diffusion Additive Manufacturing (ADAM).

52. The method of claim 48, wherein the additively manufacturing the second portion is performed subsequent to the additively manufacturing the first portion.

53. The method of claim 48, further comprising performing, using the MAP, a subtractive manufacturing (SM) operation on the component.

54. The method of claim 53, wherein the SM operation comprises milling.

* * * * *